United States Patent
Kumagai et al.

(10) Patent No.: US 9,538,104 B2
(45) Date of Patent: Jan. 3, 2017

(54) IMAGING APPARATUS, IMAGING METHOD, MANUFACTURING APPARATUS, MANUFACTURING METHOD, AND ELECTRONIC APPARATUS

(71) Applicant: Sony Corporation, Tokyo (JP)

(72) Inventors: Yoshimichi Kumagai, Kanagawa (JP); Takashi Abe, Kanagawa (JP); Kazuyoshi Yamashita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 26 days.

(21) Appl. No.: 14/484,012

(22) Filed: Sep. 11, 2014

(65) Prior Publication Data

US 2015/0077612 A1 Mar. 19, 2015

(30) Foreign Application Priority Data

Sep. 18, 2013 (JP) ................................. 2013-193375

(51) Int. Cl.
*H04N 5/355* (2011.01)
*H01L 27/146* (2006.01)
(Continued)

(52) U.S. Cl.
CPC ...... *H04N 5/3559* (2013.01); *H01L 27/14603* (2013.01); *H01L 27/14609* (2013.01);
(Continued)

(58) Field of Classification Search
CPC .... H04N 5/3559; H04N 5/3597; H04N 5/772; H01L 27/14612; H01L 27/14603; H01L 27/14689; H01L 27/14609; H01L 27/14656; Y10T 29/41
See application file for complete search history.

(56) References Cited

U.S. PATENT DOCUMENTS

| 7,965,326 | B2 * | 6/2011 | Furuta | H04N 9/045 |
| | | | | 348/294 |
| 8,456,559 | B2 * | 6/2013 | Yamashita | H01L 27/14643 |
| | | | | 250/208.1 |

(Continued)

FOREIGN PATENT DOCUMENTS

| JP | H06-097415 | 4/1994 |
| JP | 2002-064751 | 2/2002 |

(Continued)

OTHER PUBLICATIONS

Official Action (no English translation available) for Japanese Patent Application No. 2013-193375 mailed Oct. 6, 2016, 12 pages.

*Primary Examiner* — Aung S Moe
(74) *Attorney, Agent, or Firm* — Sheridan Ross P.C.

(57) ABSTRACT

There is provided an imaging apparatus that includes a photoelectric conversion section, a retention section, and first and second gates. The photoelectric conversion section is configured to convert a received light into charge. The retention section is configured to retain the charge provided by the photoelectric conversion section. The first and second gates are provided between the photoelectric conversion section and the retention section, the first and second gates being turned ON for transferring the charge from the photoelectric conversion section to the retention section, and the second gate being turned OFF after the first gate is turned OFF.

19 Claims, 20 Drawing Sheets

(51) Int. Cl.
*H04N 5/359* (2011.01)
*H04N 5/77* (2006.01)

(52) U.S. Cl.
CPC .. *H01L 27/14612* (2013.01); *H01L 27/14656* (2013.01); *H01L 27/14689* (2013.01); *H04N 5/3597* (2013.01); *H04N 5/772* (2013.01); *Y10T 29/41* (2015.01)

(56) References Cited

U.S. PATENT DOCUMENTS

| | | | | |
|---|---|---|---|---|
| 9,142,576 B2* | 9/2015 | Machida | ........... | H01L 27/14601 |
| 2006/0049431 A1* | 3/2006 | Kaida | ............... | H01L 27/14609 257/222 |
| 2006/0084195 A1* | 4/2006 | Lyu | ................... | H01L 27/14603 438/48 |
| 2006/0208163 A1* | 9/2006 | Manabe | ............... | H04N 3/1512 250/208.1 |
| 2009/0251582 A1* | 10/2009 | Oike | ................. | H01L 27/14609 348/308 |
| 2010/0091157 A1* | 4/2010 | Yamashita | ........... | H04N 5/3559 348/300 |
| 2010/0220227 A1* | 9/2010 | Mizumura | ........ | H01L 27/14603 348/308 |
| 2011/0233707 A1* | 9/2011 | Fukuro | ............. | H01L 27/14612 257/435 |
| 2011/0241079 A1* | 10/2011 | Oike | ................. | H01L 27/14616 257/225 |
| 2011/0242379 A1* | 10/2011 | Kato | ................. | H01L 27/14609 348/300 |
| 2011/0242386 A1* | 10/2011 | Machida | ........... | H01L 27/14603 348/308 |
| 2012/0153125 A1* | 6/2012 | Oike | ................. | H01L 27/14612 250/208.1 |
| 2013/0188085 A1* | 7/2013 | Shim | ................. | H01L 27/14603 348/333.08 |
| 2014/0014816 A1* | 1/2014 | Takeda | ............. | H01L 27/14818 250/208.1 |

FOREIGN PATENT DOCUMENTS

| | | |
|---|---|---|
| JP | 2008-193527 | 8/2008 |
| JP | 2011-133464 | 7/2011 |
| JP | 2011-176334 | 9/2011 |
| JP | 2011-217315 | 10/2011 |
| JP | 2012-129797 A | 7/2012 |
| JP | 2012-189599 | 10/2012 |
| JP | 2013-021533 A | 1/2013 |
| JP | 2013-171889 | 9/2013 |

* cited by examiner

IMAGING APPARATUS, IMAGING METHOD, MANUFACTURING APPARATUS, MANUFACTURING METHOD, AND ELECTRONIC APPARATUS

CROSS REFERENCE TO RELATED APPLICATIONS

This application claims the benefit of Japanese Priority Patent Application JP 2013-193375 filed Sep. 18, 2013, the entire contents of which are incorporated herein by reference.

BACKGROUND

The present disclosure relates to imaging apparatuses, imaging methods, manufacturing apparatuses, manufacturing methods, and electronic apparatuses, and more specifically, to an imaging apparatus, an imaging method, a manufacturing apparatus, a manufacturing method, and an electronic apparatus that are suitable for use to increase a dynamic range.

The recent imaging apparatuses used in digital video cameras, digital still cameras, or others include a plurality of CCDs (Charge Coupled Devices), CMOS (Complementary Metal-Oxide Semiconductors) devices, or others that are two-dimensionally arranged.

For implementing simultaneous accumulation of electric charge in a CMOS image sensor, there is the global shutter technology with which signals are temporarily stored in a memory. With this global shutter technology, each pixel is provided with a memory, and the memories in the pixels are provided all at once with electric charge accumulated in a light-receiving section. The memories then store the charge until row-by-row reading is performed so that the pixels are all exposed for the same duration of time (for example, refer to Patent Application Laid-open Nos. 2012-129797 and 2013-21533).

SUMMARY

With the global shutter technology, signals are temporarily stored in memories in pixels, and this expects transfer of electric charge once to the memories. However, in the process of gate turn-off during readout to the memories, there is a possibility of reducing the dynamic range due to the reduced amount of charge. There thus is a demand for further increasing the dynamic range, and improving the performance as a sensor also with the global shutter technology.

It is thus desirable to increase the dynamic range to contribute to improved performance.

According to an embodiment of the present disclosure, there is provided an imaging apparatus, including: a photoelectric conversion section configured to convert a received light into charge; a retention section configured to retain the charge provided by the photoelectric conversion section; and first and second gates provided between the photoelectric conversion section and the retention section, the first and second gates being turned ON for transferring the charge from the photoelectric conversion section to the retention section, and the second gate being turned OFF after the first gate is turned OFF.

The first gate may accumulate the charge.

The first gate may prevent a backflow of the charge from the retention section to the photoelectric conversion section.

The first gate may be disposed to be in contact with the photoelectric conversion section, and the second gate is disposed in the vicinity of the retention section.

The first and second gates may be disposed next to each other above the photoelectric conversion section.

The second gate may be disposed in the vicinity of another photoelectric conversion section, the other photoelectric conversion section being adjacent to the photoelectric conversion section provided with the first gate.

The first and second gates may be formed in a same size ratio.

One of the first and second gates may be formed larger than the other.

The first and second gates may be each in a polygon shape.

The first and second gates may be each formed with a segment of a circle.

The imaging apparatus according to the embodiment of the present disclosure may further include: a floating diffusion region configured to accumulate the charge from the retention section; and a third gate provided between the retention section and the floating diffusion region. In the imaging apparatus, after the first and second gates are turned OFF, the third gate may be turned ON, and transfer of charge may be started from the retention section to the floating diffusion region.

The third gate may be disposed not to be in contact with the first and second gates.

The first gate may be configured by a plurality of pieces.

The second gate may be configured by a plurality of pieces.

According to an embodiment of the present disclosure, there is provided an imaging method in an imaging apparatus including a photoelectric conversion section configured to convert a received light into charge, a retention section configured to retain the charge provided by the photoelectric conversion section, and first and second gates provided between the photoelectric conversion section and the retention section, the imaging method including: turning ON the first and second gates for transferring the charge from the photoelectric conversion section to the retention section; and turning OFF the second gate after turning OFF the first gate.

According to an embodiment of the present disclosure, there is provided a manufacturing apparatus for manufacturing an imaging apparatus including a photoelectric conversion section configured to convert a received light into charge, a retention section configured to retain the charge provided by the photoelectric conversion section, first and second gates provided between the photoelectric conversion section and the retention section, and a processing section configured to turn ON the first and second gates for transferring the charge from the photoelectric conversion section to the retention section, and to turn OFF the second gate after turning OFF the first gate.

The photoelectric conversion section and the retention section may be formed in a substrate, and the first and second gates may be formed on the substrate.

According to an embodiment of the present disclosure, there is provided a manufacturing method for manufacturing an imaging apparatus including a photoelectric conversion section configured to convert a received light into charge, a retention section configured to retain the charge provided by the photoelectric conversion section, first and second gates provided between the photoelectric conversion section and the retention section, and a processing section configured to turn ON the first and second gates for transferring the charge from the photoelectric conversion section to the retention section, and to turn OFF the second gate after turning OFF the first gate.

The manufacturing method may further include: forming the photoelectric conversion section and the retention section in a substrate; and forming the first and second gates on the substrate.

According to an embodiment of the present disclosure, there is provided an electronic apparatus, including: an imaging apparatus including a photoelectric conversion section configured to convert a received light into charge, a retention section configured to retain the charge provided by the photoelectric conversion section, and first and second gates provided between the photoelectric conversion section and the retention section, the first and second gates being turned ON for transferring the charge from the photoelectric conversion section to the retention section, and the second gate being turned OFF after the first gate is turned OFF; and a signal processing section configured to perform signal processing to a pixel signal coming from the photoelectric conversion section.

In an imaging apparatus and method according to an embodiment of the present disclosure, a received light is converted into charge, the charge being the conversion result is retained after transfer, and first and second gates are provided for controlling the transfer of charge.

At the time of the transfer of charge, the first and second gates are turned ON, and after the first gate is turned OFF, the second gate is turned OFF.

In a manufacturing apparatus and method according to an embodiment of the present disclosure, the imaging apparatus is manufactured.

An electronic apparatus according to an embodiment of the present disclosure includes the imaging apparatus.

According to an embodiment of the present disclosure, the dynamic range of an image sensor such as CMOS is increased, and the performance as the sensor is improved.

Note that the effect described herein is not restrictive, and any effect described in the present disclosure is also included.

These and other objects, features and advantages of the present disclosure will become more apparent in light of the following detailed description of best mode embodiments thereof, as illustrated in the accompanying drawings.

DETAILED DESCRIPTION OF EMBODIMENT

Hereinafter, an embodiment of the present disclosure (hereinafter, simply referred to as embodiment) will be described with reference to the drawings. The description is given in the following order.

1. Configuration of Solid-State Imaging Device
2. Configuration of Unit Pixel
3. Another Configuration of Unit Pixel
4. Exemplary Unit Pixel Layout
5. About Manufacturing
6. Electronic Apparatus

[Configuration of Solid-State Imaging Device]

Figure 1:
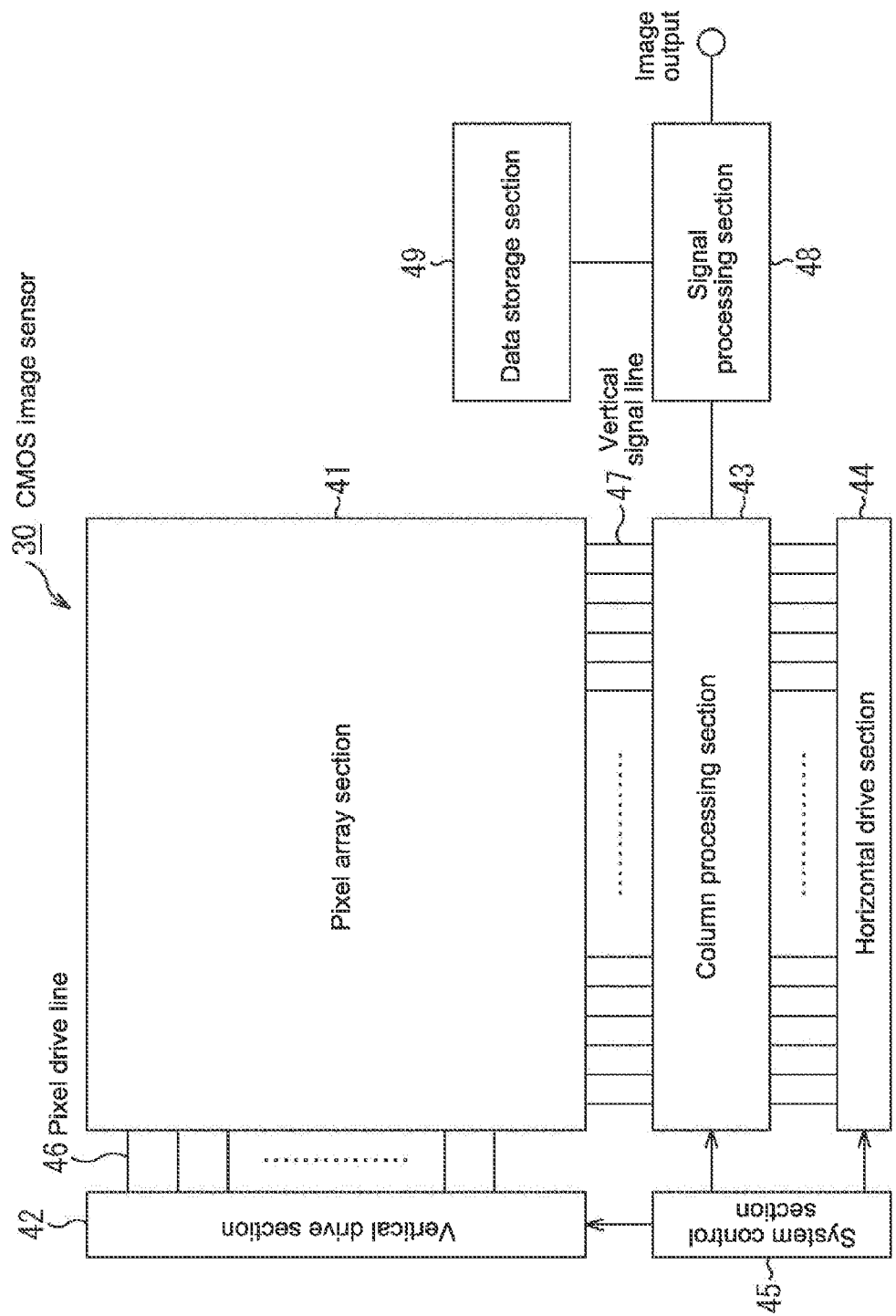
FIG. 1 is a diagram showing an exemplary configuration of a solid-state imaging device in an embodiment with the application of the present disclosure.

FIG. 1 is a block diagram showing an exemplary configuration of a CMOS (Complementary Metal Oxide Semiconductor) image sensor as a solid-state imaging device with the application of the present disclosure.

A CMOS image sensor 30 includes a pixel array section 41, a vertical drive section 42, a column processing section 43, a horizontal drive section 44, and a system control section 45. These components, i.e., the pixel array section 41, the vertical drive section 42, the column processing section 43, the horizontal drive section 44, and the system control section 45, are formed on a semiconductor substrate (chip) that is not shown.

The pixel array section 41 includes a plurality of unit pixels (the unit pixels 50 of FIG. 2) that are two-dimensionally arranged in a matrix. These unit pixels are each provided with a photoelectric conversion element that generates an amount of photoelectric charge appropriate to an amount of incoming light for storage. In the below, the amount of photoelectric charge appropriate to the amount of incoming light is sometimes simply referred to as "charge", and the unit pixel is sometimes simply referred to as "pixel".

The pixel array section 41 is formed with pixel drive lines 46, and vertical signal lines 47. The pixel drive lines 46 are formed to each row of pixels in the matrix along the lateral direction of FIG. 1, i.e., along the alignment direction of the pixels in the rows, and the vertical signal lines 47 are formed to each column of pixels therein along the vertical direction of FIG. 1, i.e., along the alignment direction of the pixels in the columns. Each of the pixel drive lines 46 is connected at one end to the vertical drive section 42, i.e., to an output terminal provided to each row of the vertical drive section 42.

The CMOS image sensor 30 also includes a signal processing section 48, and a data storage section 49. These components, i.e., the signal processing section 48, and the data storage section 49, may or may not be provided on the substrate of the CMOS image sensor 30, e.g., may be provided on a different outside substrate, and may be implemented by DSP (Digital Signal Processor) or software processing.

The vertical drive section 42 is configured by a shift register, an address decoder, or others, and is a pixel drive section that drives the pixels in the pixel array section 41 all at once or on a row basis. Although the specific configuration is not shown, this vertical drive section 42 includes a read scanning system and a discharge scanning system, or a collective discharge system, a collective transfer system.

For reading of signals from the unit pixels, the read scanning system selectively scans the pixel array section 41 one by one the rows of unit pixels therein. For driving of the rows of pixels, i.e., with the rolling shutter operation, rows of pixels for reading are subjected to discharge scanning prior to scanning by the read scanning system by the duration of shutter speed. With global exposure, i.e., with the global shutter operation, collective discharge is performed prior to collective transfer by the duration of shutter speed.

With such discharge, any unwanted charge is discharged from the photoelectric conversion element of each of the unit pixels in the row for reading, i.e., charge resetting is performed. This discharge (resetting) of unwanted charge leads to a so-called electronic shutter operation. Herein, the electronic shutter operation is to newly start exposure after removing the photoelectric charge in the photoelectric conversion elements, i.e., to start accumulation of photoelectric charge.

Signals to be obtained by the reading operation of the read scanning system correspond to an amount of light entering after the preceding read operation or electronic shutter operation. For driving of the rows of pixels, a photoelectric-charge accumulation period (exposure period) in each of the unit pixels is the duration from reading by the preceding reading operation or discharge by the preceding electronic shutter operation until reading by the current reading operation. For global exposure, the photoelectric-charge accumulation period (exposure time) is the duration from collective discharge until collective transfer.

After the selective scanning to the rows of pixels by the vertical drive section 42, each of the unit pixels outputs a pixel signal. The resulting pixel signals are supplied to the column processing section 43 via the vertical signal lines 47. The column processing section 43 performs predetermined signal processing on the pixel signals provided by the unit pixels in a selected row via the vertical signal lines 47. Such signal processing is performed on the basis of a column of pixels in the pixel array section 41, and the column processing section 43 temporarily stores the resulting pixel signals after the signal processing.

To be specific, the signal processing performed by the column processing section 43 at least includes noise removal, e.g., CDS (Correlated Double Sampling). By the column processing section 43 performing CDS, any pixel-specific fixed pattern noise is removed, e.g., reset noise, or threshold variation in an amplifier transistor. Herein, such noise removal is not restrictive, and the column processing section 43 may be provided with a capability of AD (Analog-Digital) conversion to output a signal level in digital form.

The horizontal drive section 44 is configured by a shift register, an address decoder, or others, and selects one by one a unit circuit corresponding to each column of pixels in the column processing section 43. By this selective scanning by the horizontal scanning section 44, the pixel signals being the results of signal processing by the column processing section 43 are sequentially output to the signal processing section 48.

The system control section 45 is configured by a timing generator that generates various types of timing signals, for example. Based on the various types of timing signals generated by the timing generator, the components are controlled and driven, i.e., the vertical drive section 42, the column processing section 43, and the horizontal drive section 44.

The signal processing section 48 is at least provided with a capability of addition processing, and performs various types of signal processing including addition processing or others on the pixel signals provided by the column processing section 43. The data storage section 49 temporarily stores data expected for use with the signal processing by the signal processing section 48.

[Configuration of Unit Pixel]

Described next is the specific configuration of each of the unit pixels 50, which are arranged in a matrix in the pixel array section 41 of FIG. 1. The pixels with the application of the present disclosure are able to increase the dynamic range so that the performance as a sensor is improved. For proving that the pixels produce such an effect, a description is first given about a pixel with no application of the present disclosure, and then about a pixel with the application of the present disclosure.

Figure 2:
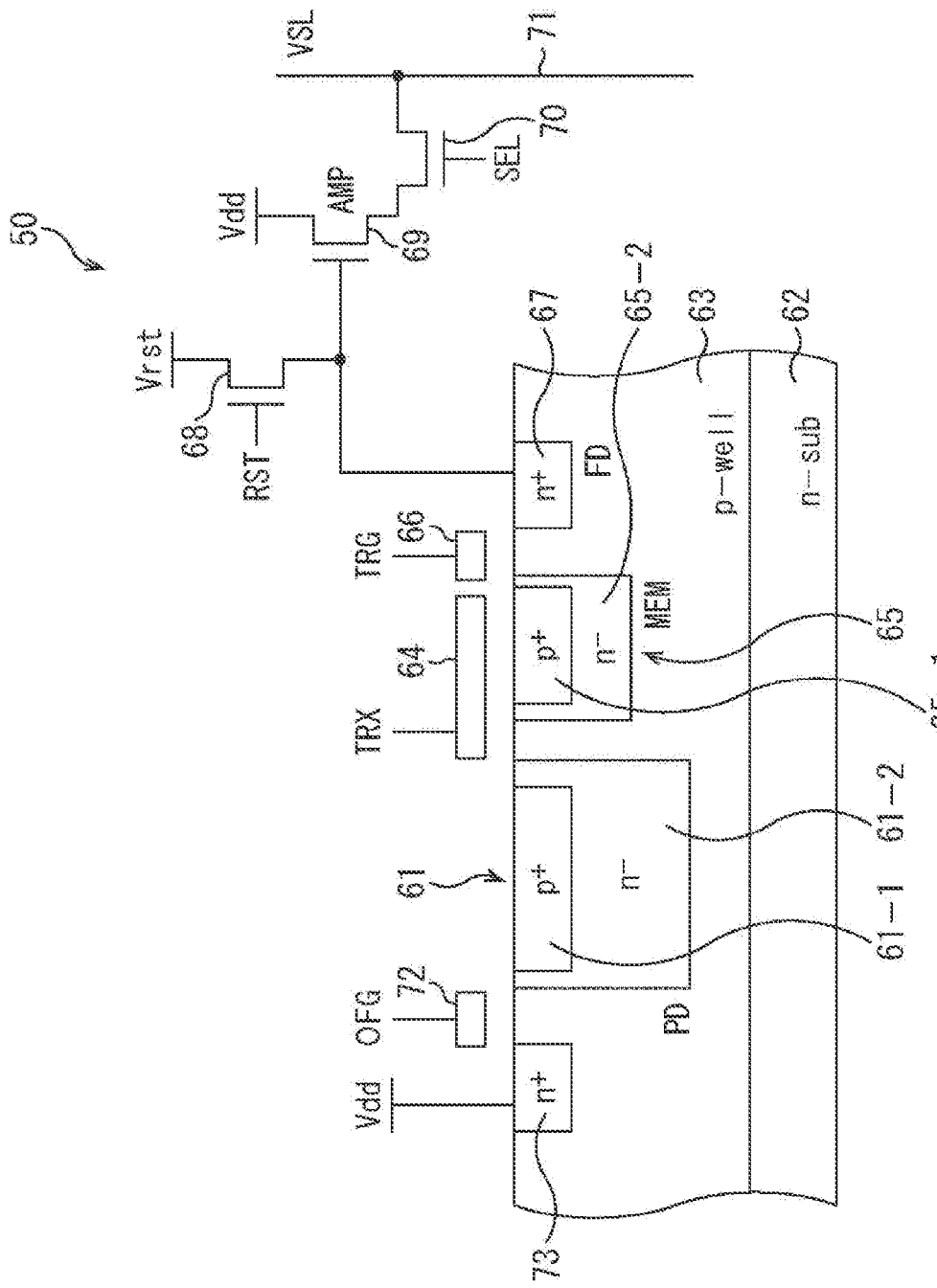
FIG. 2 is a diagram showing an exemplary configuration of a unit pixel.

FIG. 2 shows an exemplary configuration of the unit pixel. The unit pixel 50 is a photoelectric conversion element, and includes a photodiode (PD) 61, for example. This photodiode 61 is an embedded photodiode formed by an n-type embedded layer 61-2 embedded into a p-type well layer 63 on an n-type substrate 62, and by a p-type layer 61-1 formed on the substrate surface side, for example. In this example, the impurity concentration in the n-type embedded layer 61-2 causes depletion at the time of emission of charge.

In addition to the photodiode 61, the unit pixel 50 includes a TRX gate 64 and a memory section (MEM) 65. In the unit pixel 50 of FIG. 2, a gate electrode of the TRX gate 64 is provided above a portion of the p-type well layer 63 between the photodiode 61 and the memory section 65. In the unit pixel 50, the memory section 65 is formed by an n-type diffusion region 65-2 embedded into the p-type well layer 63, and by a p-type layer 65-1 formed on the substrate surface side.

Even when the memory section 65 is formed by the n-type diffusion region 65-2 as above, the effect to be produced thereby is similar to the memory section 65 formed by an embedded channel. To be specific, with the memory section 65 formed by the n-type diffusion region 65-2 inside of the p-type well layer 63 and by the p-type layer 65-1 on the substrate surface side, the n-type diffusion region 65-2 of the memory section 65 is protected from accumulation of dark current generated on the Si—SiO$_2$ interface. This thus contributes to the improved image quality.

The TRX gate 64 performs transfer of charge in response to a drive signal TRX applied to the gate electrode thereof. The charge herein is the one accumulated in the photodiode 61 after photoelectric conversion therein. The memory section 65 is light-shielded and is formed by an n-type embedded channel, which is positioned below the TRX gate 64. The memory section 65 accumulates the charge coming from the photodiode 61 by the transfer by the TRX gate 64.

The memory section 65 is modulated by the drive signal TRX applied to the gate electrode of the TRX gate 64. That is, the memory section 65 is increased in potential by the drive signal TRX applied to the gate electrode of the TRX gate 64. Therefore, the saturated amount of charge for the memory section 65 is increased more than for a not-modulated memory section.

The unit pixel 50 also includes a TRG gate 66, and a floating diffusion region (FD) 67. The TRG gate 66 transfers the charge accumulated in the memory section 65 to the floating diffusion region 67 in response to a drive signal TRG applied to a gate electrode thereof.

The floating diffusion region 67 is a charge-voltage conversion section configured by an n-type layer, and performs charge-voltage conversion on the charge coming from the memory section 65 by the transfer by the TRG gate 66.

The unit pixel 50 also includes a reset transistor (RST) 68, an amplifier transistor (AMP) 69, and a selection transistor (SEL) 70. FIG. 2 shows an example of using an n-channel MOS (Metal Oxide Semiconductor) transistor for each of these transistors, i.e., the reset transistor 68, the amplifier transistor 69, and the selection transistor 70. However, such a combination of conductivity types is not restrictive to the transistors, i.e., the reset transistor 68, the amplifier transistor 69, and the selection transistor 70.

The reset transistor 68 is connected between a power supply Vrst and the floating diffusion region 67, and resets the floating diffusion region 67 in response to a drive signal RST applied to a gate electrode thereof. In the amplifier transistor 69, a drain electrode thereof is connected to a power supply Vdd, and a gate electrode thereof is connected to the floating diffusion region 67, thereby reading the voltage of the floating diffusion region 67.

In the selection transistor 70, a drain electrode thereof is connected to a source electrode of the amplifier transistor 69, and a source electrode thereof is connected to a corresponding vertical signal line 71, for example. The selection transistor 70 makes a selection from the unit pixels 50 for reading of a pixel signal in response to a drive signal SEL applied to a gate electrode thereof. As an alternative configuration, the selection transistor 70 may be connected between the power supply Vdd and a drain electrode of the amplifier transistor 69.

One or more of the transistors, i.e., the reset transistor 68, the amplifier transistor 69, and the selection transistor 70, may not be provided depending on the manner of reading the pixel signals.

In the unit pixel 50 of FIG. 2 and others in alternative configurations that will be described later, the p-type well layer 63 is formed with the n-type embedded channel. Such a conductivity type is not restrictive, and may be a p-type. If this is the case, the relationship of potential that will be described later may be entirely reversed.

The unit pixel 50 of FIG. 2 is provided also with an overflow gate (OFG) 72 for anti-blooming. This OFG 72 emits the charge in the photodiode 61 to an n-type layer 73 in response to a drive signal OFG applied to a gate electrode thereof at the start of exposure. The n-type layer 73 is under the application of predetermined voltage Vdd.

With the CMOS image sensor 30 in the above configuration, the global shutter operation (global exposure) is realized by all pixels being exposed starting at the same time and stopping at the same time, and by transferring the charge accumulated in the photodiode 61 to the light-shielded memory section 65. With such a global shutter operation, images are obtained with no distortion because the pixels are exposed simultaneously all at once.

In the below, as to the components, i.e., the TRX gate 64, the TRG gate 66, the reset transistor 68, and the selection transistor 70, applying the drive signals TRX, TRG, RST, and SEL respectively to their gate electrodes is expressed simply as being ON, or as turning ON the TRX gate 64, the TRG gate 66, the reset transistor 68, and the selection transistor 70. Also as to the above components, stopping applying the drive signals TRX, TRG, RST, and SEL respectively to their gate electrodes is expressed simply as being OFF, or turning OFF the TRX gate 64, the TRG gate 66, the reset transistor 68, and the selection transistor 70.

Figure 3:
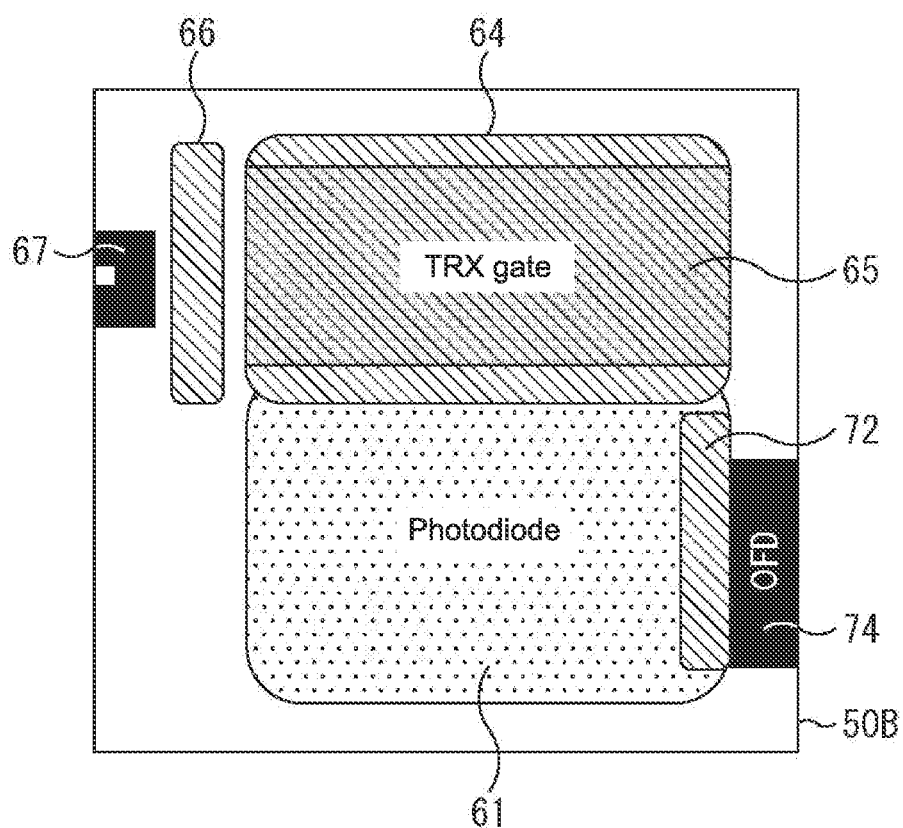
FIG. 3 is a diagram showing another exemplary configuration of the unit pixel of FIG. 2.

FIG. 3 is a diagram showing the unit pixel 50 when it is viewed from the above, i.e., from the upper portion of FIG. 2. An OFD 74 positioned on the lower right side in FIG. 2 represents a drain connected to a reset gate of the photodiode 61. On the left side of the OFD 74, there is the photodiode 61 via the OFG 72.

On the above of the photodiode 61, there is the memory section 65. When the unit pixel 50 is viewed from the above, the region of the memory section 65 includes the TRX gate 64. As described above, the TRX gate 64 is provided for transfer of charge from the photodiode 61 to the memory section 65.

On the left side of the memory section 65 in the drawing, there is the floating diffusion region 67 via the TRG gate 66. As described above, this TRG gate 66 is provided for transfer of charge from the memory section 65 to the floating diffusion region 67.

Figure 4:
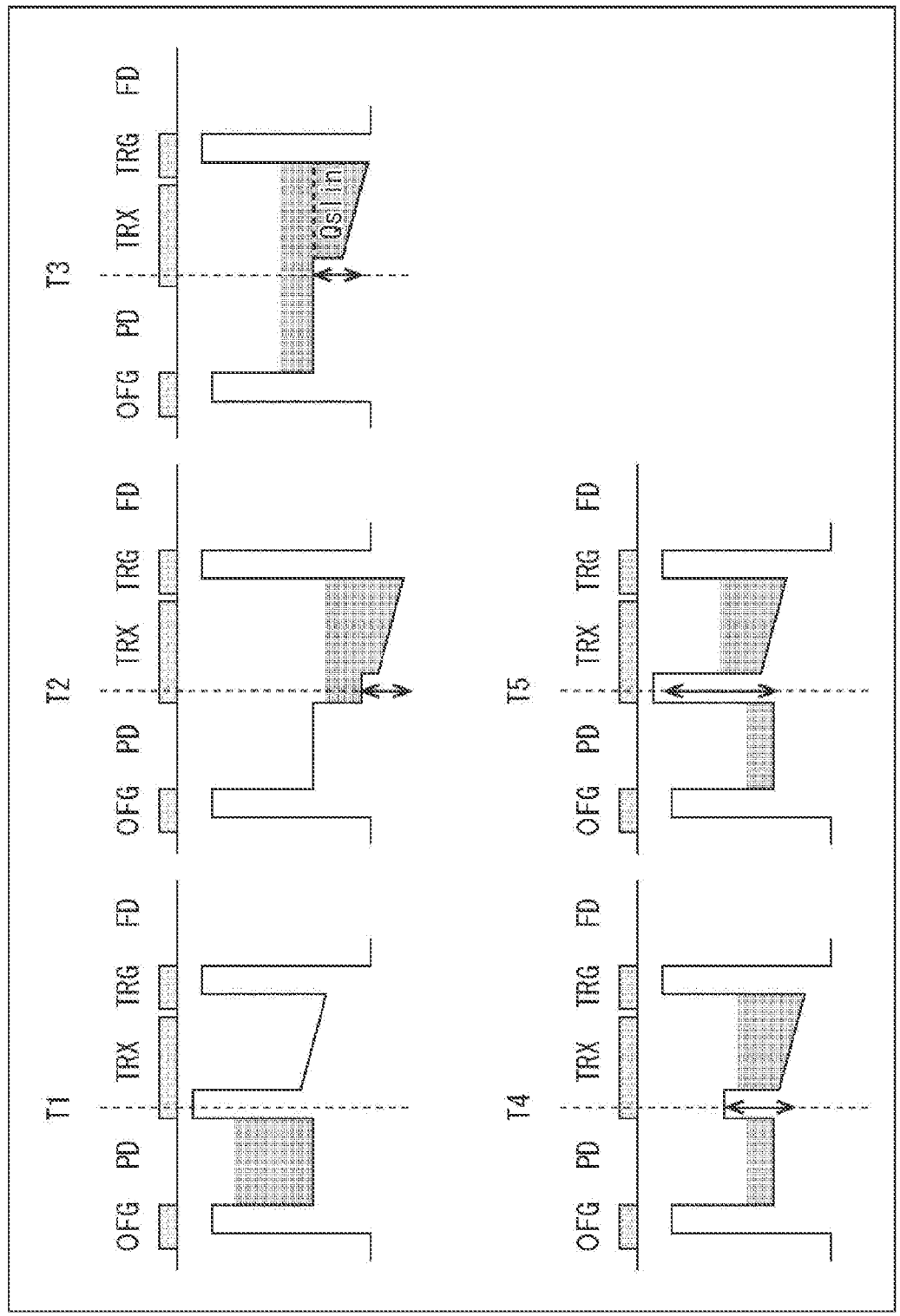
FIG. 4 is a potential diagram for illustrating as an example how the unit pixel is driven.

By referring to FIG. 4, described next is the operation of the unit pixel 50 of FIGS. 2 and 3. FIG. 4 is a potential diagram of the unit pixel 50.

At Time T1, the unit pixel 50 is exposed so that charge is accumulated in the photodiode 61 thereof. In this state, the memory section 65 and the floating diffusion region 67 are both in the initial state (is reset).

From Time T2 to T4, transfer of charge is performed from the photodiode 61 to the memory section 65. When the drive signal TRX (the TRX gate 64) is ON, the charge accumulated in the photodiode 61 is transferred to the memory section 65. At Time T5, when the TRX gate 64 is turned OFF, the memory section 65 stores the charge.

The state at Time T3 and T4 is now referred to. In the state at Time T3, the transfer of charge is in progress from the photodiode 61 to the memory section 65, and a part of the charge flows back to the photodiode 61.

In the state with such a backflow, if the TRX gate 64 is turned OFF at Time T4, the charge flown back to the photodiode 61 remains therein.

That is, when transfer of charge is performed from the photodiode 61 to the memory section 65, the charge is partially left in the photodiode 61. This is represented by the graph of FIG. 5.

Figure 5:
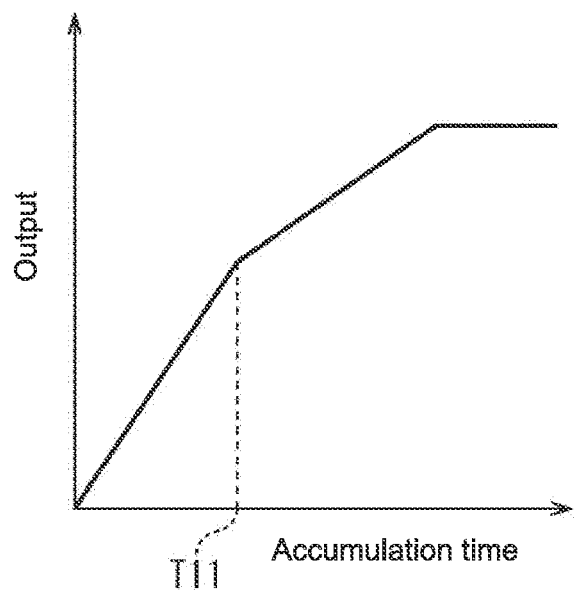
FIG. 5 is a diagram for illustrating an amount of electric charge available for use.

The graph of FIG. 5 is referred to. In the graph of FIG. 5, the horizontal axis indicates an accumulation time, and the vertical axis indicates an output. The accumulation time is proportional to an accumulated amount of charge in the photodiode 61, i.e., the longer the accumulation time, the larger the accumulated amount of charge becomes. Therefore, the amount of charge for output increases proportionally with the accumulation time.

In the graph of FIG. 5, however, the slope shows a change at Time T11 in the accumulation time, i.e., the linearity is not maintained, and the graph is curved with the lapse of time. This tells that even if the charge is accumulated in the photodiode 61 with the lapse of time for accumulation, the charge to be output is not proportional thereto. This is considered due to a backflow of charge to the photodiode 61 occurring during transfer of charge to the memory section 65 as described above by referring to FIG. 4.

As shown in FIG. 5, if the linearity is not maintained, this results in a reduced amount of charge available for use. That is, an amount of charge available for use is the charge accumulated until Time T11 before the linearity starts to be lost, and any charge accumulated after Time T11 is not used. This thus reduces the dynamic range, and the performance as the unit pixel 50 is impaired.

Figure 6:
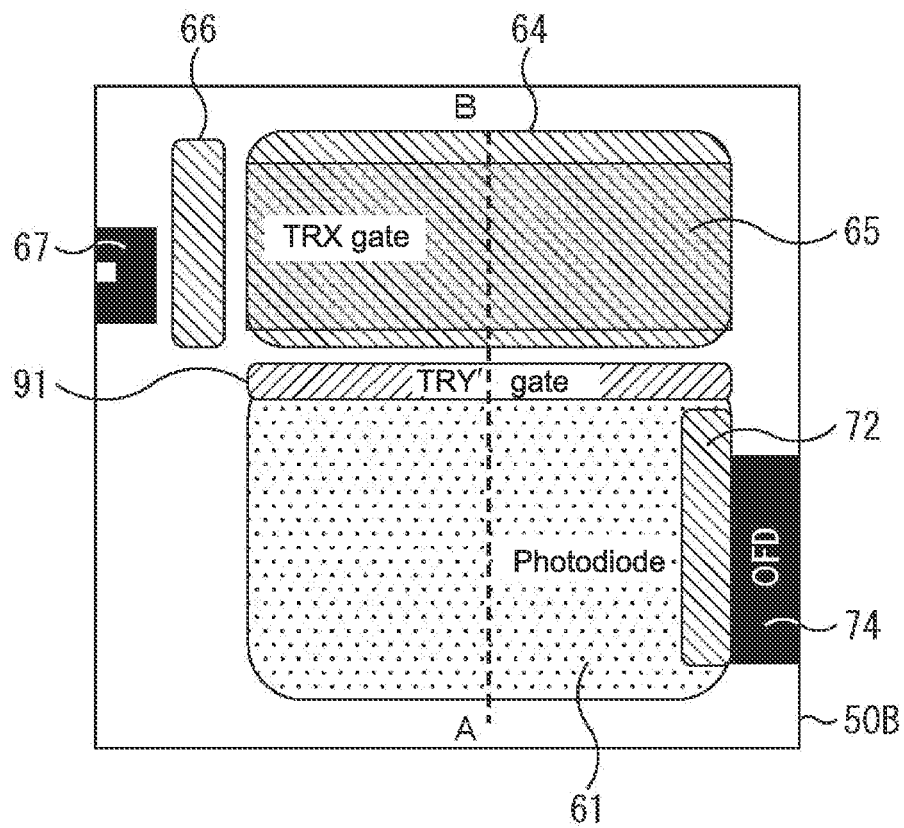
FIG. 6 is a diagram showing another exemplary configuration of the unit pixel of FIG. 2.

In consideration thereof, as shown in FIG. 6, the unit pixel 50 is additionally provided with a TRY gate 91. FIG. 6 is a diagram showing another exemplary configuration of the unit pixel 50. In this example, the unit pixel of FIG. 6 is referred to as unit pixel 50B for distinction from the unit pixel 50 of FIG. 3.

The TRY gate 91 of the unit pixel 50B of FIG. 6 functions as a gate to prevent a backflow of charge from the memory section 65 to the photodiode 61, and is provided between the photodiode 61 and the memory section 65 as shown in FIG. 6.

For prevention of a backflow of charge to the photodiode 61, the TRY gate 91 is provided, the TRY gate 91 is turned ON when transfer of charge is started from the photodiode 61 to the memory section 65, and the TRY gate 91 is then turned OFF not to cause a backflow of charge to the photodiode 61.

Figure 7:
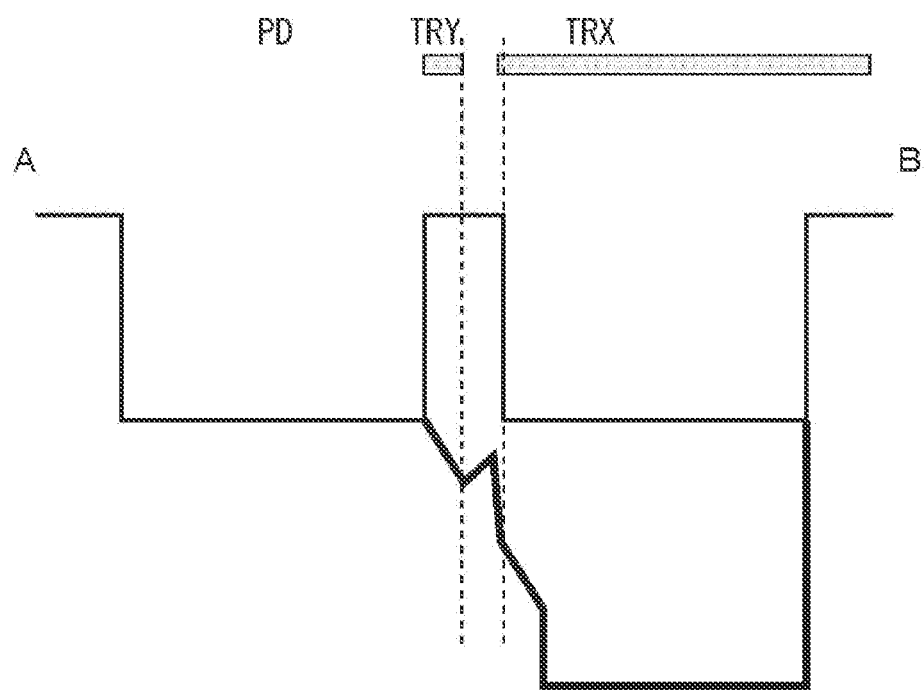
FIG. 7 is a diagram for illustrating how a gate serves as a barrier during transfer of electric charge.

The concern here is that additionally providing a gate causes a difficulty in complete transfer of charge from the photodiode 61 to the memory section 65 as shown in FIG. 7. In FIG. 7, a thin line indicates when accumulation of charge is in progress, and a thick line indicates when transfer of charge is in progress.

At the time of accumulation of charge in the photodiode 61, the TRY gate 91 is turned OFF. At the time of transfer of charge from the photodiode 61 to the memory section 65, the TRY gate 91 is turned ON. At this time, the TRY gate 91 may function as a barrier, and the charge from the photodiode 61 may not be partially transferred due to the barrier.

Figure 8:
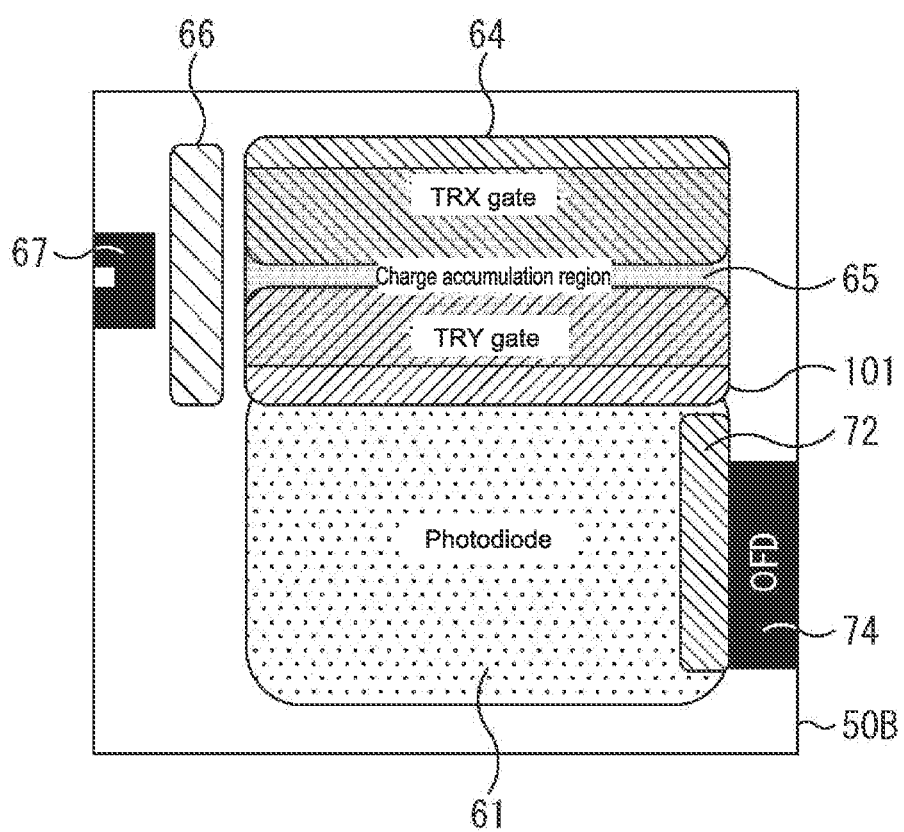
FIG. 8 is a diagram showing another exemplary configuration of the unit pixel of FIG. 2.

In consideration thereof, the unit pixel 50 is configured as shown in FIG. 8 to prevent a backflow of charge to the photodiode 61, and to allow transfer of charge from the photodiode 61 entirely if possible to the memory section 65.

[Another Configuration of Unit Pixel]

FIG. 8 is a diagram showing still another configuration of the unit pixel 50. The unit pixel of FIG. 8 is referred to as unit pixel 50C for distinction from the unit pixels 50 and 50B of FIGS. 3 and 6.

Similarly to the unit pixel 50B of FIG. 6, the unit pixel 50C includes a TRY gate, but this TRY gate 101 is provided with a memory function of accumulation of charge. The memory function of the TRY gate 101 may be provided to the memory section 65, or separately from the memory section 65.

Figure 9:
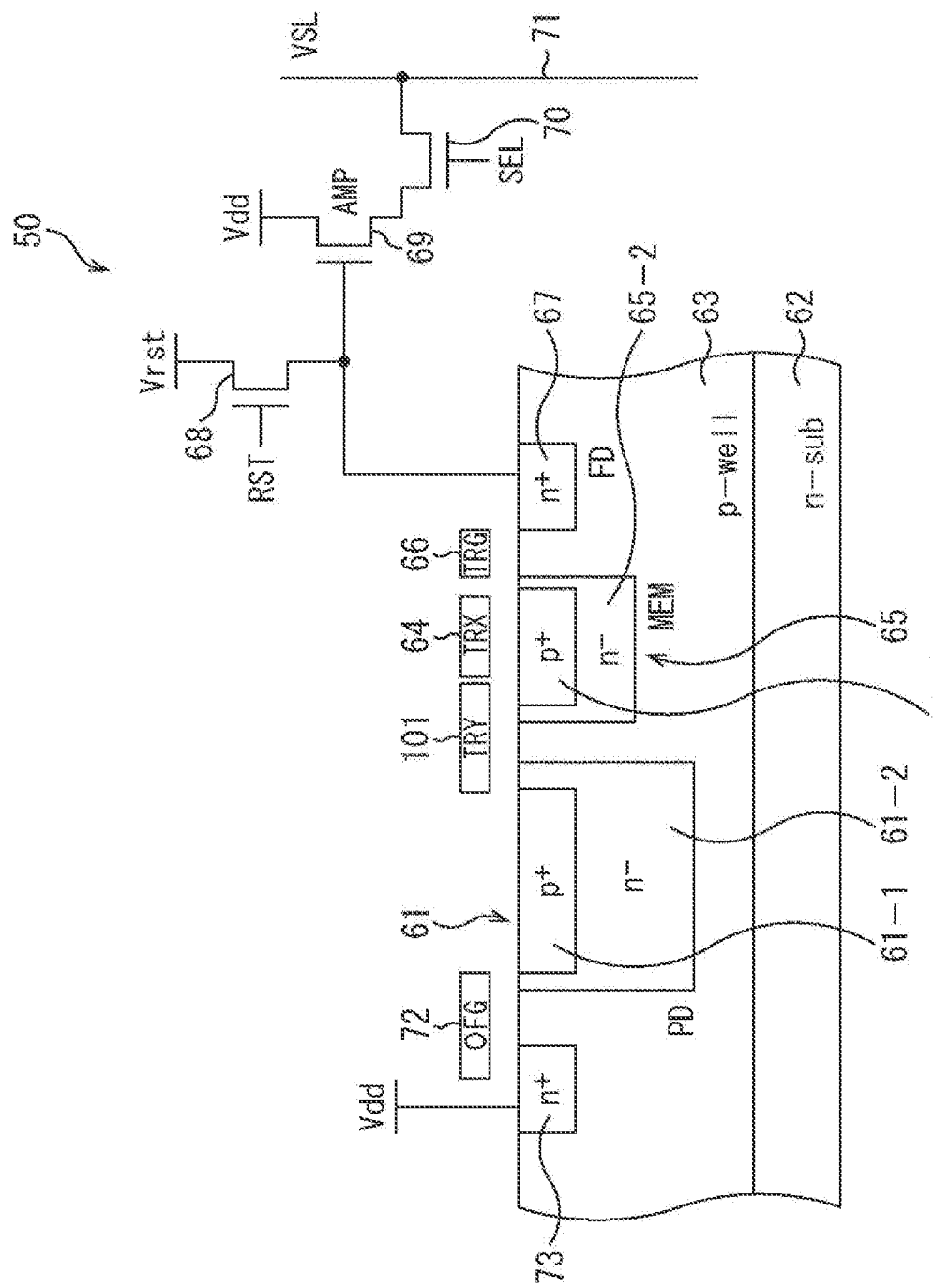
FIG. 9 is a diagram showing another exemplary configuration of the unit pixel of FIG. 8.

FIG. 9 is a cross-sectional view of the unit pixel 50C as that of the unit pixel 50 of FIG. 2. Comparing with the unit pixel 50 of FIG. 2, the unit pixel 50C of FIG. 9 is additionally provided with the TRY gate 101, which is a difference therefrom. The additionally-provided TRY gate 101 is disposed at the position for connection to the photodiode 61 and the memory section 65. The TRX gate 64 is disposed in the vicinity of the memory section 65.

In the unit pixel 50C configured as above, the TRY gate 101 functions as a gate for transfer of charge from the photodiode 61 to the memory section 65, and also as a gate for preventing a backflow of charge from the memory section 65 to the photodiode 61.

The TRX gate functions as a gate for transfer of charge from the photodiode 61 to the memory section 65, and also as a gate for retention of charge in the memory section 65.

Figure 10:
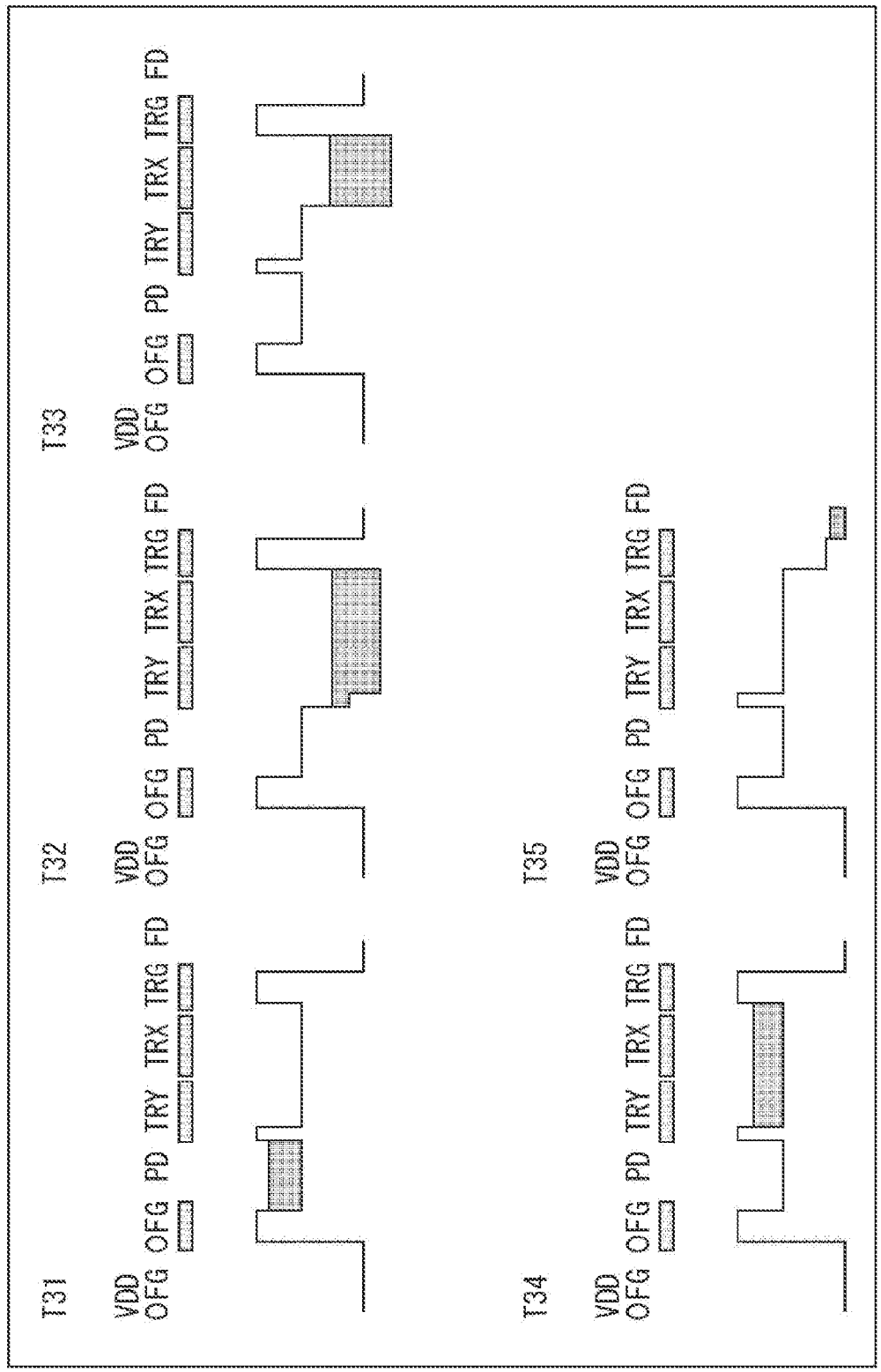
FIG. 10 is a potential diagram for illustrating as an example how the unit pixel of FIG. 8 is driven.

By referring to the potential diagram of FIG. 10, described next is the operation of the unit pixel 50C including such a TRY gate 101.

At Time T31, accumulation of charge is started in the photodiode 61. At the time of accumulation of charge in the photodiode 61, the components are all being turned OFF, i.e., the OFG 72, the TRY gate 101, the TRX gate 64, and the TRG gate 66.

At Time T32, transfer of charge is started from the photodiode 61 to the memory section 65. When transfer of charge is started, the TRY gate 101 and the TRX gate 64 are both turned ON. By the TRY gate 101 and the TRX gate 64 both being turned ON, the charge in the photodiode 61 starts to flow to the memory section 65, and the charge is retained by the retention function of the TRY gate 101 and that of the TRX gate 64.

At Time T33, the TRY gate 101 is turned OFF. At Time T33, only the TRX gate 64 is being ON. At Time T33, the charge retained by the retention function of the TRY gate 101 starts to flow to the side of the TRX gate 64, and is retained by the retention function of the TRX gate 64.

At Time T34, the TRX gate 64 is also turned OFF. By the TRX gate 64 being turned OFF, the transfer of charge to the memory section 65 is completed, and the charge is retained in the memory section 65.

At Time T35, the TRG gate 66 is turned ON, and the charge retained in the memory section 65 is transferred to the floating diffusion region 67.

For transfer of charge from the photodiode 61 to the memory section 65 as above, the TRX gate 64 and the TRY gate 101 are provided. At the time of transfer of charge from the photodiode 61 to the memory section 65, the TRX gate 64 and the TRY gate 101 are both turned ON for transfer of charge.

Thereafter, the TRY gate 101 is turned OFF but the TRX gate 64 remains turned ON. By the TRY gate 101 being turned OFF, the charge reached in the memory section 65 is prevented from flowing back to the photodiode 61.

Moreover, by providing the retention function to the TRY gate 101 for retention of charge, the TRY gate 101 becomes capable of retention of charge by the retention function. As described above by referring to FIGS. 6 and 7, additionally providing a gate between the photodiode 61 and the memory section 65 possibly causes a difficulty in complete transfer of charge from the photodiode 61. However, by providing the retention function to the TRY gate 101 for retention of charge, such a possibility is avoided, and the memory section 65 is able to receive entirely the charge from the photodiode 61.

Figure 11:
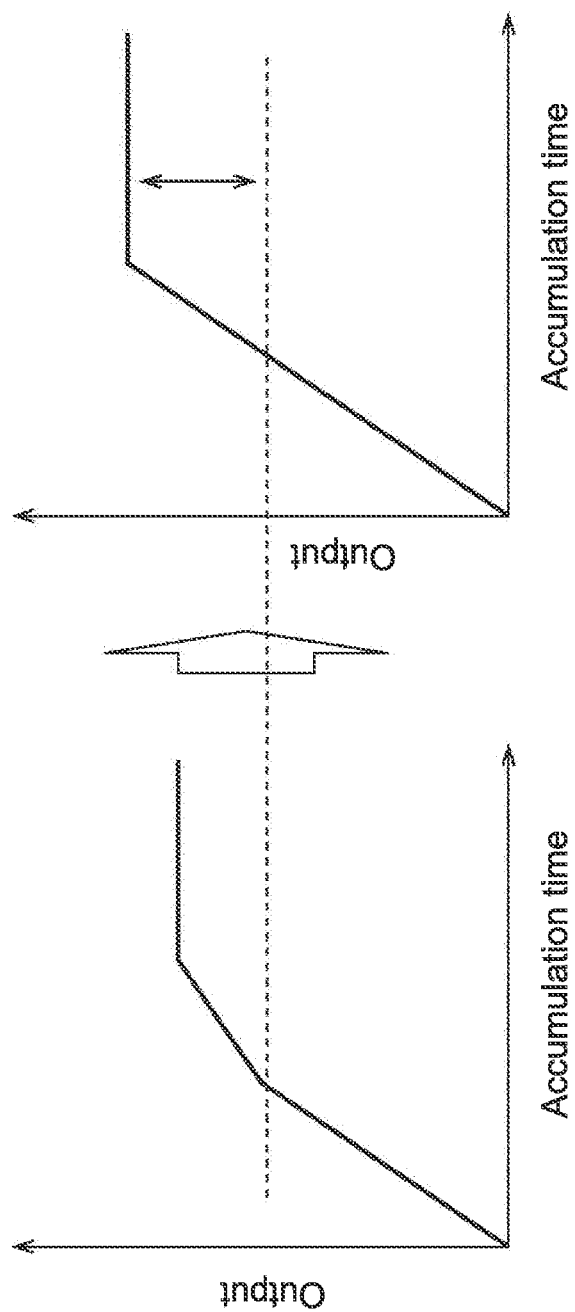
FIG. 11 is a diagram for illustrating an amount of electric charge available for use.

That is, as shown on the right side of FIG. 11, the linearity of charge is maintained between accumulation and output, thereby increasing the amount of charge available for use. The graph on the left side of FIG. 11 is the same as that of FIG. 7, and the graph on the right side of FIG. 11 is the one obtained from the unit pixel 50C described by referring to FIGS. 8 to 10.

As described above by referring to FIG. 7, when a backflow of charge occurs toward the photodiode 61, as shown by the graph on the left side of FIG. 11, the linearity is lost between the accumulation time (the accumulated amount of charge) and output. Therefore, the charge available for use is the one accumulated only while the linearity is maintained.

On the other hand, the unit pixel 50C described above by referring to FIGS. 8 to 10 is able to prevent a backflow of charge to the photodiode 61 so that the linearity is maintained between the accumulation time (the accumulated amount of time) and output as in the graph on the right side of FIG. 11. That is, as shown in the graph on the right side of FIG. 11, the unit pixel 50C obtains the graph that is not curved with the lapse of time so that the linearity is maintained until the amount of charge reaches its actual saturation point.

The amount of charge up to the actual saturation point becomes the amount of charge available for use. This thus increases the dynamic range of the imaging apparatus using the unit pixels 50C so that the performance thereof is accordingly improved.

[Exemplary Layout in Unit Pixel]

In the unit pixel 50C, the TRY gate 101 and the TRX gate 64 of FIG. 8 are not restrictive, i.e., the layout position, the shape, the size, and others. FIGS. 12 to 23 show other exemplary layouts in the unit pixel 50C for description. In each of unit pixels to be described below, the TRY gate 101 is included as is in the unit pixel 50C of FIG. 8, and thus the unit pixels and the components therein are under the same reference numerals as those in FIG. 8.

Figure 12:
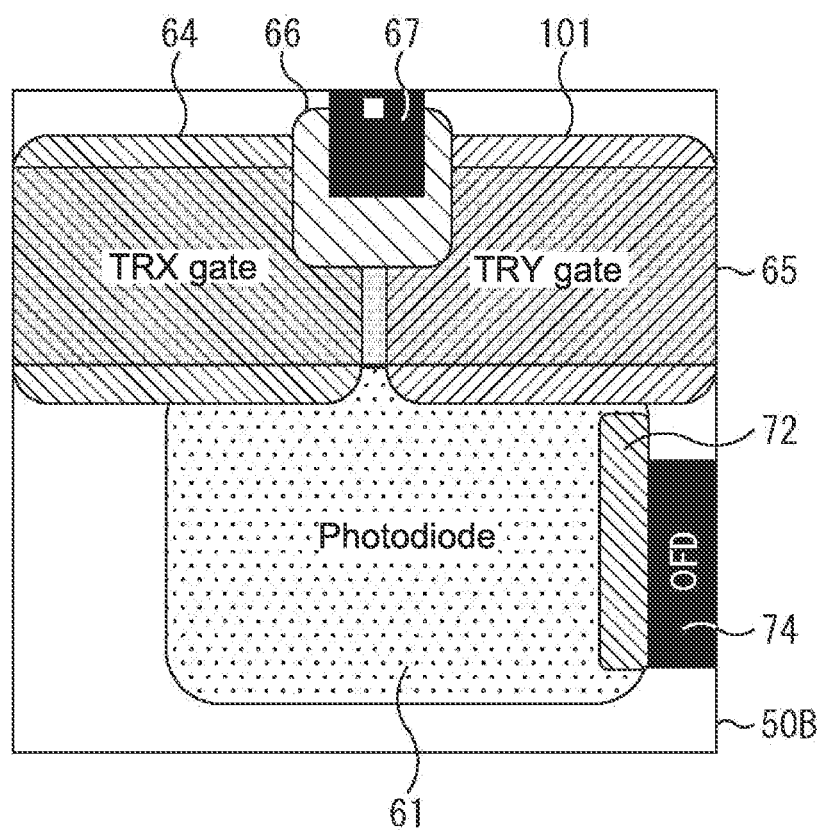
FIG. 12 is a diagram for illustrating another configuration of the unit pixel of FIG. 8.
Figure 13:
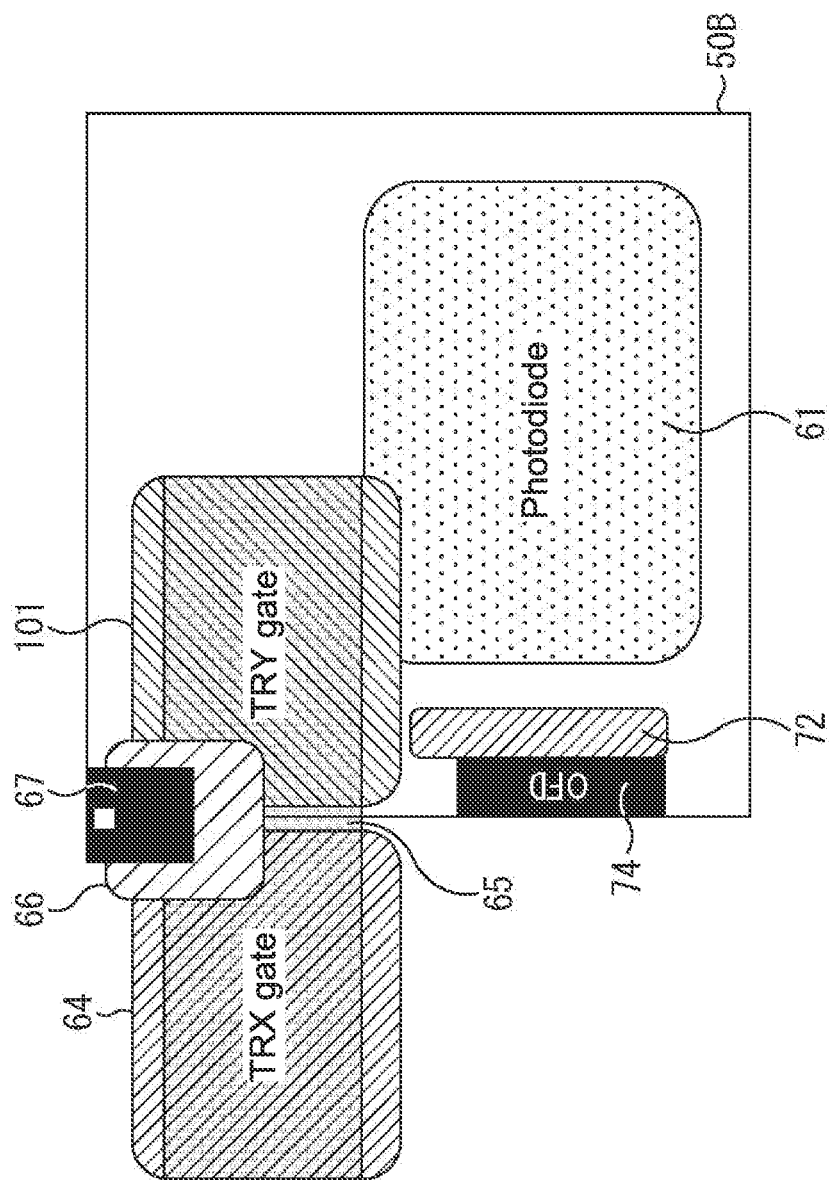
FIG. 13 is a diagram for illustrating still another configuration of the unit pixel of FIG. 8.
Figure 14:
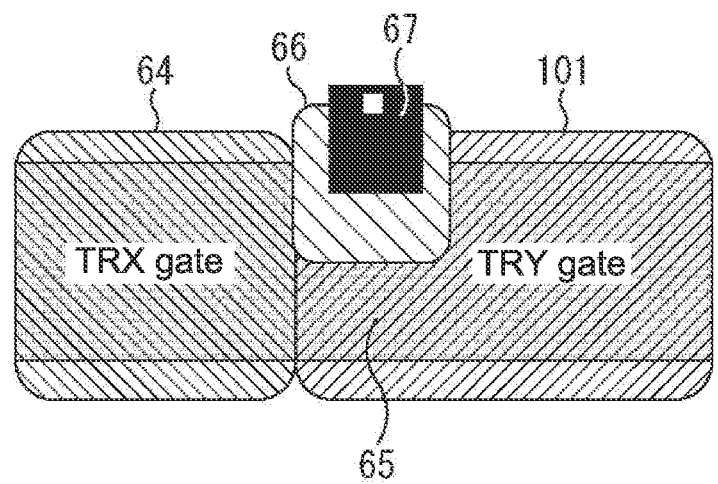
FIG. 14 is a diagram for illustrating still another configuration of the unit pixel of FIG. 8.
Figure 15:
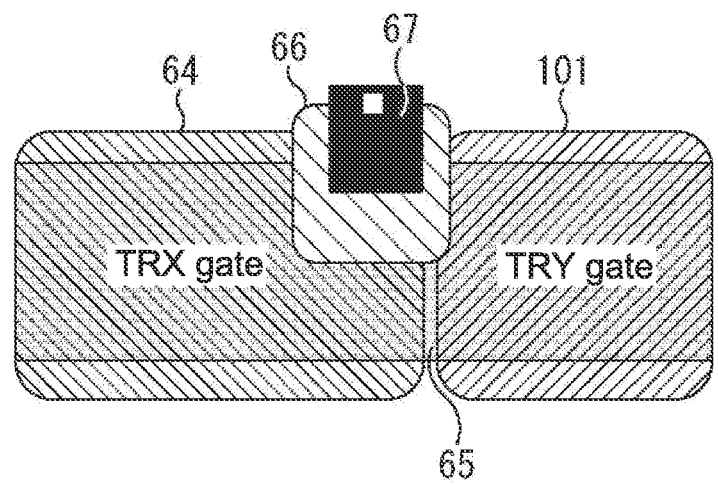
FIG. 15 is a diagram for illustrating still another configuration of the unit pixel of FIG. 8.
Figure 16:
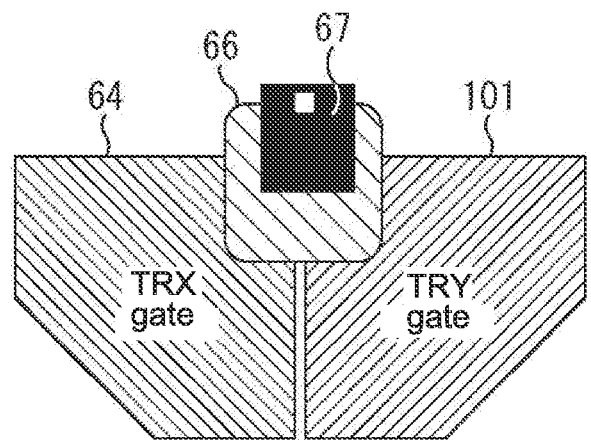
FIG. 16 is a diagram for illustrating still another configuration of the unit pixel of FIG. 8.
Figure 17:
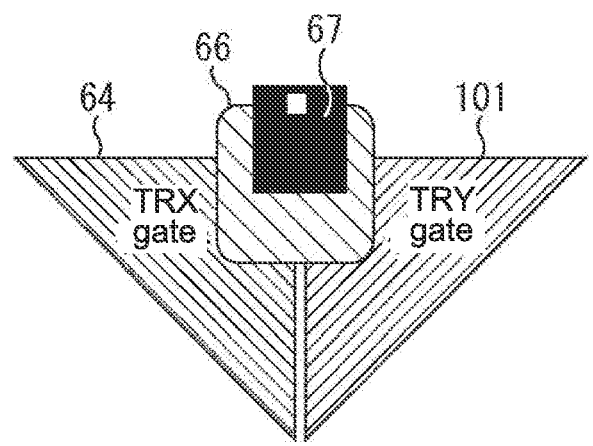
FIG. 17 is a diagram for illustrating still another configuration of the unit pixel of FIG. 8.
Figure 18:
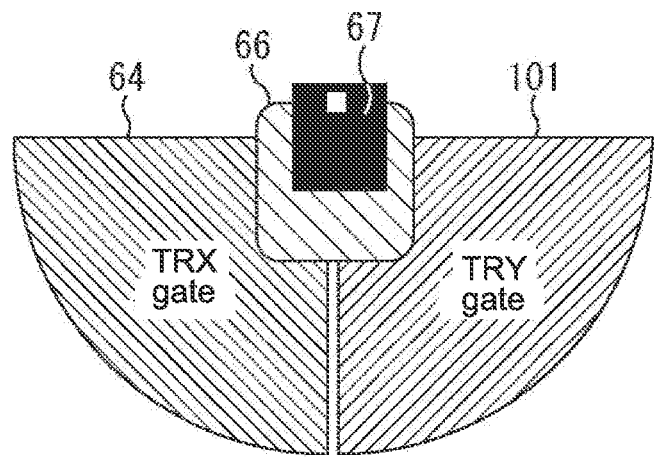
FIG. 18 is a diagram for illustrating still another configuration of the unit pixel of FIG. 8.
Figure 21:
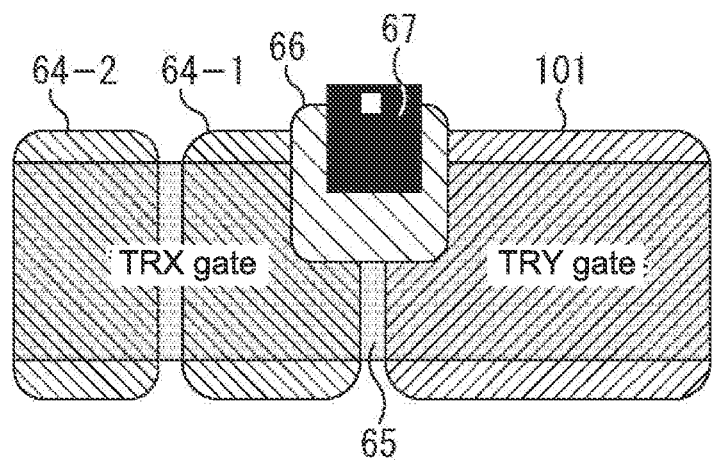
FIG. 21 is a diagram for illustrating still another configuration of the unit pixel of FIG. 8.
Figure 22:
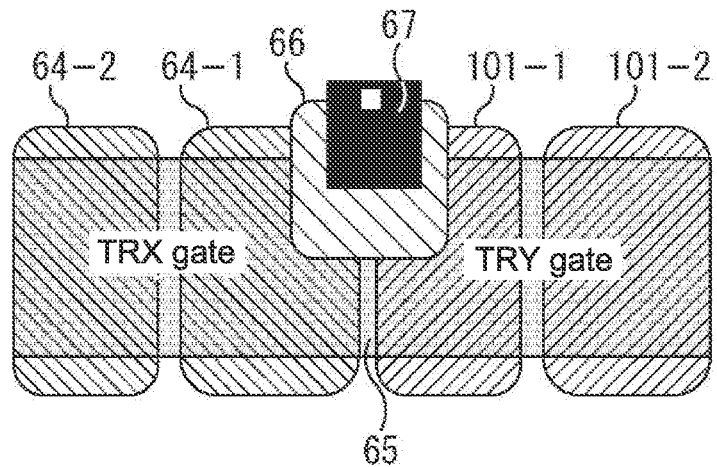
FIG. 22 is a diagram for illustrating still another configuration of the unit pixel of FIG. 8.
Figure 23:
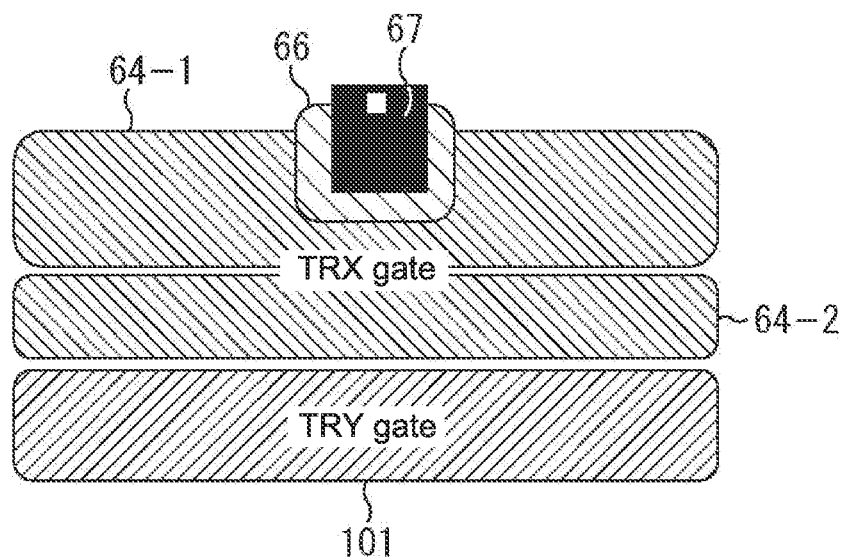
FIG. 23 is a diagram for illustrating still another configuration of the unit pixel of FIG. 8.

FIGS. 12 and 13 each show an exemplary layout position of the TRY gate 101 and that of TRX gate 64, and FIGS. 14 and 15 each show an exemplary size ratio of the TRY gate 101 and that of TRX gate 64. FIGS. 16 to 18 each show an exemplary shape of the TRY gate 101 and that of TRX gate 64, and FIGS. 19 and 20 each show an exemplary layout that the TRY gate 101 and/or the TRX gate 64 may not be in contact with the TRG gate 66. FIGS. 21 to 23 each show an exemplary layout that the TRY gate 101 and/or the TRX gate 64 may be each provided two or more.

In the unit pixel 50C of FIG. 12, the TRY gate 101 is positioned on the upper right portion of the photodiode 61, and the TRX gate 64 is positioned on the upper left portion thereof. The TRG gate 66 is positioned across the TRY gate 101 and the TRX gate 64 at the upper center portion thereof. As shown in FIG. 12, the TRY gate 101 and the TRX gate 64 may be disposed next to each other above the photodiode 61.

With such a layout, the charge in the photodiode 61 is first directed to the TRY gate 101 on the upper right portion thereof, and then is directed to the left from the TRY gate 101, i.e., to the TRX gate 64 on the upper left portion of the photodiode 61.

FIG. 12 shows an exemplary layout in which the TRY gate 101 is disposed on the upper right portion of the photodiode 61, and the TRX gate 64 is disposed on the upper left portion thereof. Alternatively, an inverse positional relationship between right and left is also possible, i.e., the TRY gate 101 may be disposed on the upper left portion of the photodiode 61, and the TRX gate 64 may be disposed on the upper right portion thereof.

In the unit pixel 50C of FIG. 13, the TRY gate 101 is disposed on the upper left portion of the photodiode 61, and the TRX gate 64 is disposed on the left side of the TRY gate 101. In this layout, the TRX gate 64 of the unit pixel 50C is positioned on the upper right portion of another unit pixel 50C' (not shown; provided with a reference numeral of 50C' for distinction from the unit pixel 50C), which is on the left side of the unit pixel 50C.

As described above, the TRX gate 64 may be positioned above the unit pixel 50C'. If this is the layout, the TRX gate 64 is disposed to be in the vicinity of the photodiode 61 of the unit pixel 50C' (not shown), which is positioned adjacent to the unit pixel 50C provided with the TRY gate 101.

Also in such a layout, the charge in the photodiode 61 is first directed to the TRY gate 101 on the upper left portion thereof, and then is directed to the TRX gate 64 on the left side of the TRY gate 101.

In the unit pixel 50C of FIG. 13, the OFG 72 or others are provided on the left side of the photodiode 61. Alternatively, similarly to the unit pixel 50C of FIG. 12, the OFG 72 may be provided on the right side of the photodiode 61.

Note that FIG. 13 shows an exemplary layout in which the TRY gate 101 is disposed on the upper left portion of the photodiode 61, and the TRX gate 64 is disposed on the left side of the TRY gate 101. This is not restrictive, and an inverse positional relationship between right and left is also possible, i.e., the TRY gate 101 is disposed on the upper right portion of the photodiode 61, and the TRX gate 64 is disposed on the right side of the TRY gate 101.

As described above, the layout in the unit pixel 50C may be not restrictive as long as the TRY gate 101 is in contact with the photodiode 61, and the charge in the photodiode 61 is transferred to the adjacent TRX gate 64.

In FIGS. 12 and 13, exemplified is the layout of including the TRY gate 101 and the TRX gate 64 above the photodiode 61. However, the TRY gate 101 and the TRX gate 64 may look like being on the left or right, or below the photodiode 61 depending on from which direction these components are viewed. In this sense, the expression of "above (upper portion, and upper side)" found in the above and below could mean "leftward (left portion, and left side), rightward (right portion, and right side), and below (lower portion, and lower side) depending on the direction of viewing. The expression of "above" is thus understood also as "leftward", "rightward", and "below", and also includes "leftward", "rightward", and "below".

In FIGS. 14 to 23, the photodiode 61 and others are not shown because these drawings are not for defining the position of the photodiode 61 in the unit pixel 50C.

In the unit pixel 50C of FIG. 14 or 15, the TRY gate 101 and the TRX gate 64 are different in size. In the unit pixel 50C of FIG. 14, the TRY gate 101 is formed larger than the TRX gate 64.

In the unit pixel 50C of FIG. 15, the TRY gate 101 is formed smaller than the TRX gate 64. As shown in FIGS. 14 and 15, the TRY gate 101 and the TRX gate 64 are not expected to be in the same size (ratio), and one may be larger than the other.

In the unit pixel 50C of FIGS. 16 to 18, the TRY gate 101 and the TRX gate 64 are different in shape. The TRY gate 101 and the TRX gate 64 of FIG. 16 are each in the shape of a heptagon.

In the unit pixel 50C described above, e.g., in the unit pixel 50C of FIG. 12, the TRY gate 101 and the TRX gate 64 are each almost in the shape of a square with a portion occupied by the TRG gate 66. In the unit pixel 50C of FIG. 16, the TRY gate 101 and the TRX gate 64 are each in the shape in which the lower right or left portion is cut out.

In the unit pixel 50C of FIG. 17, the TRY gate 101 and the TRX gate 64 are each in the shape of a triangle. The TRY gate 101 and the TRX gate 64 each have three vertices, one of which is occupied by the TRG gate 66.

In the unit pixel 50C of FIG. 18, the TRY gate 101 and the TRX gate 64 are each in the shape of a fan, i.e., shape with a segment of a circle. The TRY gate 101 and the TRX gate 64 are each in the shape of a fan in which the vertex portion is occupied by the TRG gate 66.

In the unit pixel 50C, the TRY gate 101 and the TRX gate 64 may be in such shapes as above. That is, the TRY gate 101 and the TRX gate 64 are not restricted in shape.

In the unit pixel 50C described above, exemplified are the layouts in which the TRG gate 66 is in contact with both the TRY gate 101 and the TRX gate 64. However, as shown in FIGS. 19 and 20, the TRG gate 66 is not expected to be in contact with both the TRY gate 101 and the TRX gate 64.

Figure 19:
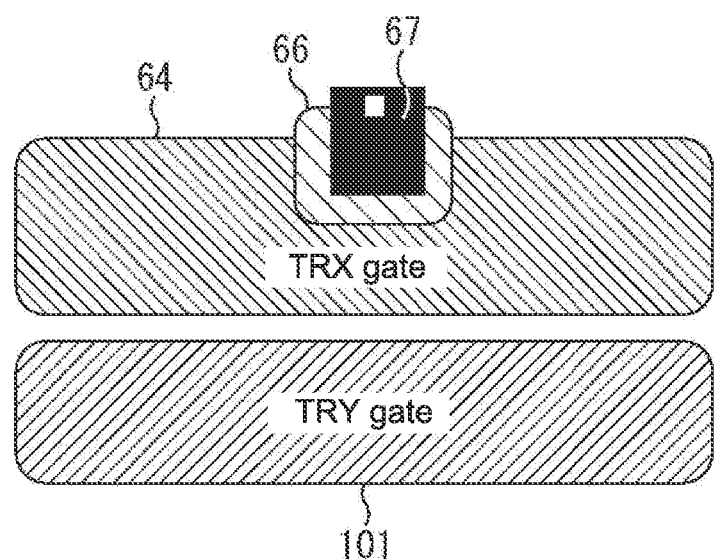
FIG. 19 is a diagram for illustrating still another configuration of the unit pixel of FIG. 8.

In the unit pixel 50C of FIG. 19, the TRY gate 101 is disposed on the lower side, and the TRX gate 64 is disposed thereabove. At the center portion of the TRX gate 64, the TRG gate 66 is provided. Moreover, the TRG gate 66 is in contact with the TRX gate 64 but not with the TRY gate 101.

Figure 20:
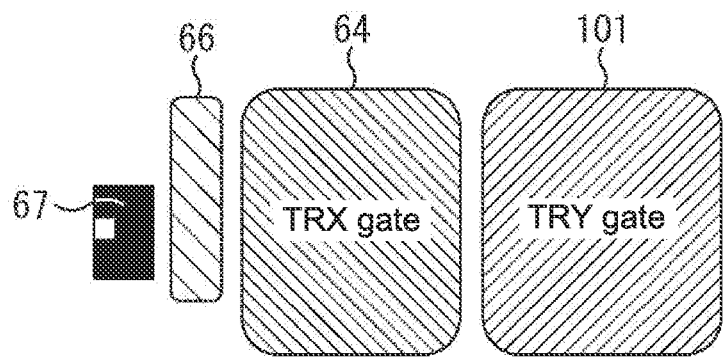
FIG. 20 is a diagram for illustrating still another configuration of the unit pixel of FIG. 8.

In the unit pixel 50C of FIG. 20, the components are disposed next to each other in order from the right in the drawing, i.e., the TRY gate 101, the TRX gate 64, and the TRG gate 66. In the example of FIG. 20, these components, i.e., the TRY gate 101, the TRX gate 64, and the TRG gate 66, are so disposed as to be away from each other. As such, these gates may be disposed to be away from each other in the lateral direction.

In the unit pixel 50C described above, exemplified are the layouts in which the TRY gate 101 and the TRX gate 64 are each a piece. Alternatively, the TRY gate 101 and the TRX gate 64 may be configured by two or more pieces.

FIG. 21 shows an example in which the TRX gate 64 is configured by two region portions. That is, the TRX gate 64 is configured by TRX gates 64-1 and 64-2, and the TRX gate 64-1 is so disposed as to be in contact with the TRG gate 66. The TRY gate 101 is a piece, and is disposed on the right side in the drawing.

FIG. 21 shows an example in which not only the TRX gate 64 but also the TRY gate 101 is configured by two region portions. In the unit pixel 50C of FIG. 22, the TRY gate 101 is configured by two pieces of TRY gates 101-1 and 101-2. The TRG gate 66 is disposed between the TRY gate 101-1 and the TRX gate 64-1 in the upper portion thereof.

The unit pixel 50C of FIG. 23 is configured similarly to that of FIG. 21, but the TRX gate 64 and the TRY gate 101 are disposed one on the other. That is, in the unit pixel 50C of FIG. 23, the components are disposed one on the other in order from the bottom in the drawing, i.e., the TRY gate 101, the TRX gate 64-2, and the TRX gate 64-1. The TRX gate 64-1 and the TRG gate 66 are so disposed as to be in contact with each other.

As described above, the TRX gate 64 and the TRY gate 101 may be each configured by two or more pieces, and may be disposed in the vertical or horizontal direction. In the layouts exemplified in the above, the components are each configured by two pieces, but may be each configured by three or four pieces.

Note that, as to the TRX gate 64 and the TRY gate 101, the position, the size, the shape, and the number of pieces described above are by way of example, and are not restrictive.

[About Manufacturing Process]

Figure 24:
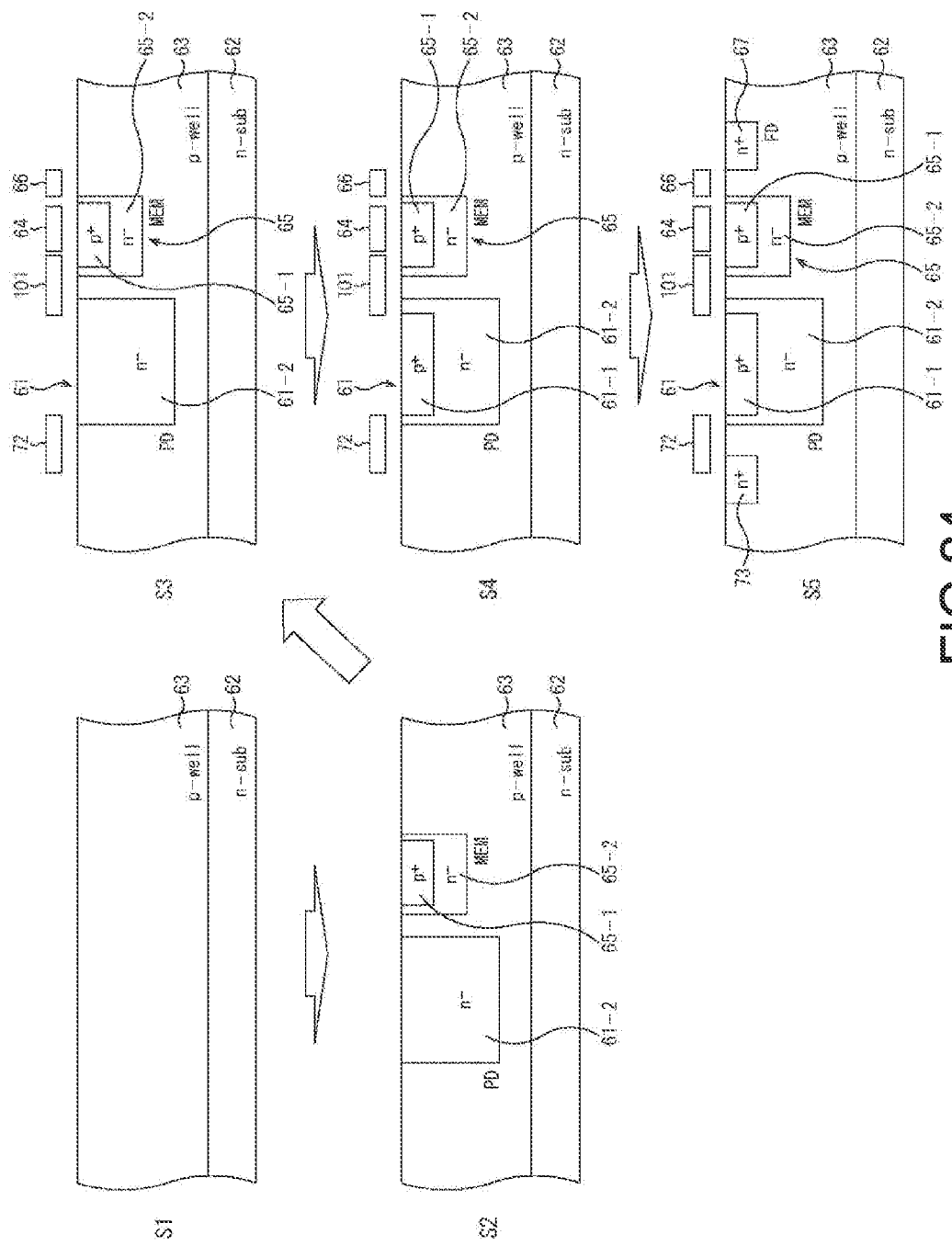
FIG. 24 is a diagram for illustrating a process of manufacturing the unit pixel of FIG. 8.

By referring to FIG. 24, described is a process of manufacturing the unit pixel 50C described above. In step S1, an SOI (Silicon on Insulator) substrate is made ready. Although exemplified now is a case of manufacturing the unit pixel 50C using the SOI substrate with an n-type charge accumulation layer, the present disclosure is applicable also to a case of using a Bulk substrate with a p-type charge accumulation layer. In step S1, a well for a transistor is also formed by ion implantation.

In step S2, the photodiode 61 being an n-type region and the memory section 65 are formed by ion plantation. When the memory section 65 is formed with a p-type region, the region is formed in step S2.

In step S3, formed are the OFG 72, the TRY gate 101, the TRX gate 64, and the TRG gate 66. The gate portion of each of these transistors is formed with polysilicon film formation by CVD (Chemical-Vapor Deposition), and lithography patterning.

In step S4, a HAD (Hole-Accumulation Diode) is formed by ion implantation. For forming the HAD, the photodiode 61 is formed with a p-type region. Forming the HAD substantially reduces dark current.

In step S5, the floating diffusion region 67 being an n-type region and the n-type layer 73 are formed by ion implantation.

The unit pixel 50C of FIG. 9 is manufactured in the above-mentioned manner. Thereafter, a microlens or others are formed as appropriate, and an imaging apparatus is manufactured. The resulting imaging apparatus including the unit pixel 50C is capable of completely transfer of charge accumulated in the photodiode 61 as described above so that the dynamic range is increased and the performance is improved.

[Electronic Apparatus]

The present disclosure is not restrictively applied to imaging apparatuses, and is applicable also to general electronic apparatuses that use an imaging apparatus in an image capture section (photoelectric conversion section), e.g., imaging apparatuses such as digital still cameras and video cameras, mobile terminals with imaging capabilities such as mobile phones, and copiers using an imaging apparatus in an image reading section. The imaging apparatus may be in the form of a module mounted in an electronic apparatuses, i.e., may be a camera module.

Figure 25:
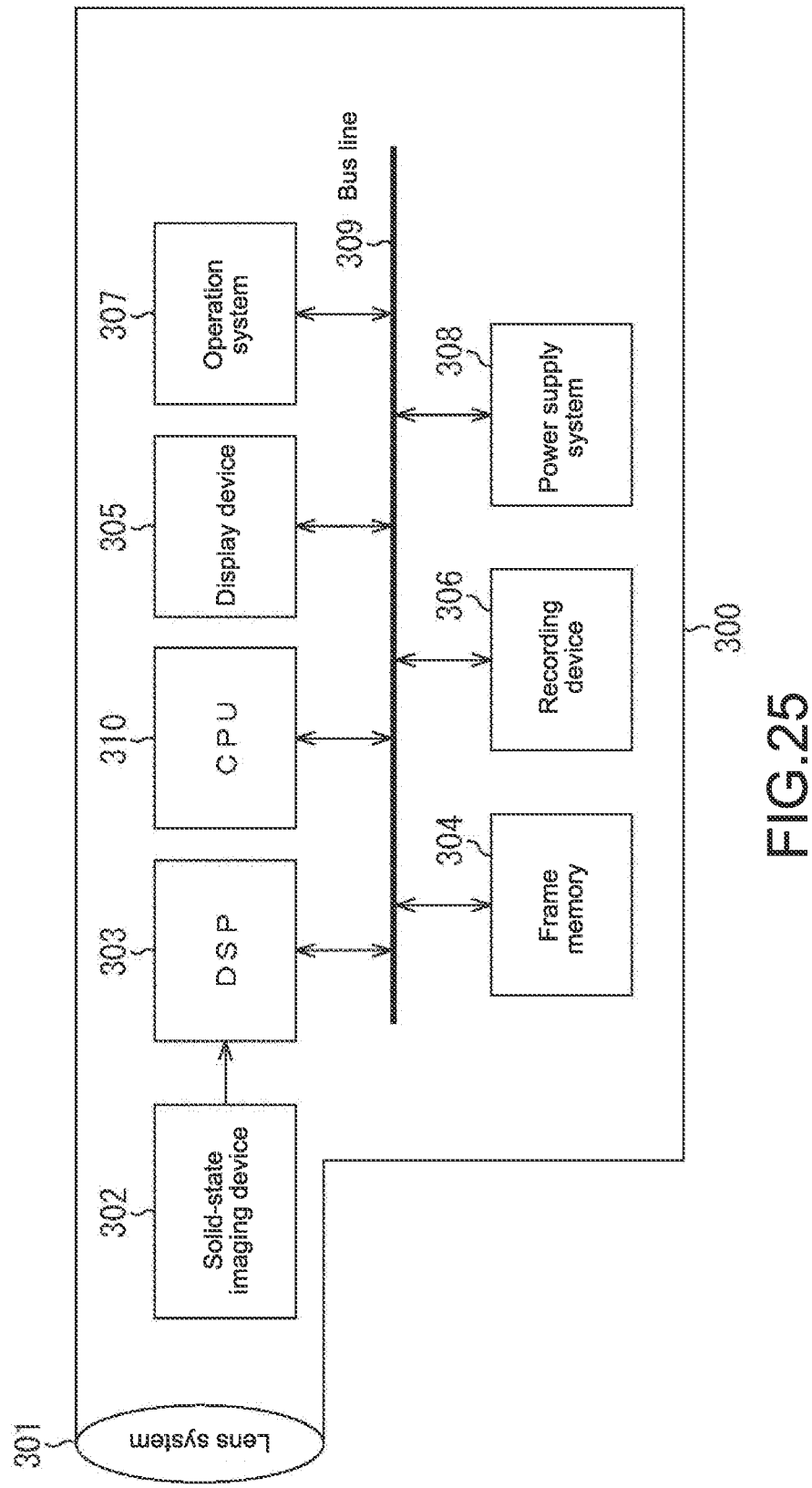
FIG. 25 is a diagram showing an exemplary configuration of an electronic apparatus.

FIG. 25 is a block diagram showing an exemplary configuration of an imaging apparatus, which is an example of an electronic apparatus according to an embodiment of the present disclosure. As shown in FIG. 25, an imaging apparatus 300 according to an embodiment of the present disclosure is provided with an optical system including a lens group 301 or others, an imaging device 302, a DSP circuit 303 being a camera signal processing section, a frame memory 304, a display device 305, a recording device 306, an operation system 307, and a power supply system 308, for example.

These components, i.e., the DSP circuit 303, the frame memory 304, the display device 305, the recording device 306, the operation system 307, and the power supply system 308, are connected to one another over a bus line 309. A CPU (Central Processing Unit) 310 controls the components in the imaging apparatus 300.

The lens group 301 captures an incoming light (image light) from an object, and forms an image on an imaging surface of the imaging device 302. After image formation on the imaging surface by the lens group 301, the imaging device 302 converts the amount of incoming light into an electric signal on a pixel basis, and outputs the resulting electric signal as a pixel signal. For use as this imaging device 302, a solid-state imaging device according to the embodiment described above is a possibility.

The display device 305 is exemplified by a panel display device such as a liquid crystal display, or an organic EL (Electro Luminescence). The display device 305 displays moving or still images captured by the imaging device 302. The recording device 306 records the moving or still images captured by the imaging device 302 on a recording medium such as video tape or DVD (Digital Versatile Disk).

The operation system 307 issues operation commands for various capabilities provided to the imaging apparatus based on a user's operation. The power supply system 308 provides a power supply as appropriate for operation of the supply targets, i.e., the DSP circuit 303, the frame memory 304, the display device 305, the recording device 306, and the operation system 307.

Such an imaging apparatus 300 is applicable to video cameras, digital still cameras, and camera modules designed for mobile devices such as mobile phones. In the imaging device 300, the imaging device according to the abovementioned embodiment is used as the imaging device 302.

In this Specification, the expression of "system" denotes the entire apparatus configured by a plurality of devices.

Further, the effect described in this Specification is by way of example and is not restrictive, and any other effect may be produced.

While the invention has been described in detail, the foregoing description is in all aspects illustrative and not restrictive. It is understood that numerous other modifications and variations can be devised without departing from the scope of the invention.

The present disclosure may be also in the following structures.

(1) An imaging apparatus, including:
a photoelectric conversion section configured to convert a received light into charge;
a retention section configured to retain the charge provided by the photoelectric conversion section; and
first and second gates provided between the photoelectric conversion section and the retention section, the first and second gates being turned ON for transferring the charge from the photoelectric conversion section to the retention section, and the second gate being turned OFF after the first gate is turned OFF.
(2) The imaging apparatus according to (1), in which
the first gate accumulates the charge.
(3) The imaging apparatus according to (1) or (2), in which
the first gate prevents a backflow of the charge from the retention section to the photoelectric conversion section.
(4) The imaging apparatus according to any one of (1) to (3), in which
the first gate is disposed to be in contact with the photoelectric conversion section, and
the second gate is disposed in the vicinity of the retention section.
(5) The imaging apparatus according to any one of (1) to (4), in which
the first and second gates are disposed next to each other above the photoelectric conversion section.
(6) The imaging apparatus according to any one of (1) to (4), in which
the second gate is disposed in the vicinity of another photoelectric conversion section, the other photoelectric conversion section being adjacent to the photoelectric conversion section provided with the first gate.
(7) The imaging apparatus according to any one of (1) to (6), in which
the first and second gates are formed in a same size ratio.
(8) The imaging apparatus according to any one of (1) to (6), in which
one of the first and second gates is formed larger than the other.
(9) The imaging apparatus according to any one of (1) to (8), in which
the first and second gates are each in a polygon shape.
(10) The imaging apparatus according to any one of (1) to (8), in which
the first and second gates are each formed with a segment of a circle.
(11) The imaging apparatus according to any one of (1) to (10), further including:
a floating diffusion region configured to accumulate the charge from the retention section; and
a third gate provided between the retention section and the floating diffusion region, wherein
after the first and second gates are turned OFF, the third gate is turned ON, and transfer of charge is started from the retention section to the floating diffusion region.
(12) The imaging apparatus according to (11), in which
the third gate is disposed not to be in contact with the first and second gates.
(13) The imaging apparatus according to any one of (1) to (12), in which
the first gate is configured by a plurality of pieces.
(14) The imaging apparatus according to any one of (1) to (12), in which
the second gate is configured by a plurality of pieces.
(15) An imaging method in an imaging apparatus including
a photoelectric conversion section configured to convert a received light into charge,
a retention section configured to retain the charge provided by the photoelectric conversion section, and
first and second gates provided between the photoelectric conversion section and the retention section, the imaging method including:
turning ON the first and second gates for transferring the charge from the photoelectric conversion section to the retention section; and
turning OFF the second gate after turning OFF the first gate.
(16) A manufacturing apparatus for manufacturing an imaging apparatus including
a photoelectric conversion section configured to convert a received light into charge,
a retention section configured to retain the charge provided by the photoelectric conversion section,
first and second gates provided between the photoelectric conversion section and the retention section, and
a processing section configured to turn ON the first and second gates for transferring the charge from the photoelectric conversion section to the retention section, and to turn OFF the second gate after turning OFF the first gate.
(17) The manufacturing apparatus according to (16), in which
the photoelectric conversion section and the retention section are formed in a substrate, and
the first and second gates are formed on the substrate.
(18) A manufacturing method for manufacturing an imaging apparatus including
a photoelectric conversion section configured to convert a received light into charge, a retention section configured to retain the charge provided by the photoelectric conversion section, first and second gates provided between the photoelectric conversion section and the retention section, and a processing section configured to turn ON the first and second gates for transferring the charge from the photoelectric conversion section to the retention section, and to turn OFF the second gate after turning OFF the first gate.

(19) The manufacturing method according to (18), further including:

forming the photoelectric conversion section and the retention section in a substrate; and forming the first and second gates on the substrate.

(20) An electronic apparatus, including:

an imaging apparatus including a photoelectric conversion section configured to convert a received light into charge, a retention section configured to retain the charge provided by the photoelectric conversion section, and first and second gates provided between the photoelectric conversion section and the retention section, the first and second gates being turned ON for transferring the charge from the photoelectric conversion section to the retention section, and the second gate being turned OFF after the first gate is turned OFF; and a signal processing section configured to perform signal processing on a pixel signal coming from the photoelectric conversion section.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging apparatus, comprising:
   a photoelectric conversion section configured to convert received light into charge;
   a retention section configured to retain the charge provided by the photoelectric conversion section;
   a floating diffusion region configured to accumulate the charge from the retention section;
   first and second gates provided between the photoelectric conversion section and the retention section, the first and second gates being turned ON for transferring the charge from the photoelectric conversion section to the retention section, and the second gate being turned OFF after the first gate is turned OFF; and
   a third gate provided between the retention section and the floating diffusion region,
   wherein after the first and second gates are turned OFF, the third gate is turned ON, and a transfer of charge is started from the retention section to the floating diffusion region.

2. The imaging apparatus according to claim 1, wherein the first gate accumulates the charge.

3. The imaging apparatus according to claim 1, wherein the first gate prevents a backflow of the charge from the retention section to the photoelectric conversion section.

4. The imaging apparatus according to claim 1, wherein the first gate is disposed to be in contact with the photoelectric conversion section, and the second gate is disposed in the vicinity of the retention section.

5. The imaging apparatus according to claim 1, wherein the first and second gates are disposed next to each other above the photoelectric conversion section.

6. The imaging apparatus according to claim 1, wherein the second gate is disposed in the vicinity of another photoelectric conversion section, the other photoelectric conversion section being adjacent to the photoelectric conversion section provided with the first gate.

7. The imaging apparatus according to claim 1, wherein the first and second gates are formed in a same size ratio.

8. The imaging apparatus according to claim 1, wherein one of the first and second gates is formed larger than the other.

9. The imaging apparatus according to claim 1, wherein the first and second gates are each in a polygon shape.

10. The imaging apparatus according to claim 1, wherein the first and second gates are each formed with a segment of a circle.

11. The imaging apparatus according to claim 1, wherein the third gate is disposed not to be in contact with the first and second gates.

12. The imaging apparatus according to claim 1, wherein the first gate is configured by a plurality of pieces.

13. The imaging apparatus according to claim 1, wherein the second gate is configured by a plurality of pieces.

14. An imaging method in an imaging apparatus comprising:
    a photoelectric conversion section configured to convert received light into charge;
    a retention section configured to retain the charge provided by the photoelectric conversion section;
    a floating diffusion region configured to accumulate the charge from the retention section;
    first and second gates provided between the photoelectric conversion section and the retention section; and
    a third gate provided between the retention section and the floating diffusion region, the imaging method comprising:
    turning ON the first and second gates for transferring the charge from the photoelectric conversion section to the retention section;
    turning OFF the second gate after turning OFF the first gate; and
    after the first and second gates are turned OFF, turning ON the third gate and starting a transfer of charge from the retention section to the floating diffusion region.

15. A manufacturing apparatus for manufacturing an imaging apparatus comprising:
    a photoelectric conversion section configured to convert received light into charge;
    a retention section configured to retain the charge provided by the photoelectric conversion section;
    a floating diffusion region configured to accumulate the charge from the retention section;
    first and second gates provided between the photoelectric conversion section and the retention section;
    a third gate provided between the retention section and the floating diffusion region; and
    a processing section configured to turn ON the first and second gates for transferring the charge from the photoelectric conversion section to the retention section, to turn OFF the second gate after turning OFF the first gate, and to turn ON the third gate after the first and second gates have been turned OFF to start a transfer of charge from the retention section to the floating diffusion region.

16. The manufacturing apparatus according to claim 15, wherein
    the photoelectric conversion section and the retention section are formed in a substrate, and
    the first and second gates are formed on the substrate.

17. A manufacturing method for manufacturing an imaging apparatus comprising:
- a photoelectric conversion section configured to convert received light into charge;
- a retention section configured to retain the charge provided by the photoelectric conversion section;
- a floating diffusion region configured to accumulate the charge from the retention section;
- first and second gates provided between the photoelectric conversion section and the retention section;
- a third gate provided between the retention section and the floating diffusion region; and
- a processing section configured to turn ON the first and second gates for transferring the charge from the photoelectric conversion section to the retention section, to turn OFF the second gate after turning OFF the first gate, and to turn ON the third gate after the first and second gates have been turned OFF to start a transfer of charge from the retention section to the floating diffusion region.

18. The manufacturing method according to claim 17, further comprising:
- forming the photoelectric conversion section and the retention section in a substrate; and
- forming the first and second gates on the substrate.

19. An electronic apparatus, comprising:
an imaging apparatus including:
- a photoelectric conversion section configured to convert received light into charge;
- a retention section configured to retain the charge provided by the photoelectric conversion section;
- a floating diffusion region configured to accumulate the charge from the retention section;
- first and second gates provided between the photoelectric conversion section and the retention section, the first and second gates being turned ON for transferring the charge from the photoelectric conversion section to the retention section, and the second gate being turned OFF after the first gate is turned OFF; and
- a third gate provided between the retention section and the floating diffusion region, wherein after the first and second gates are turned OFF, the third gate is turned ON, and transfer of charge is started from the retention section to the floating diffusion region; and
a signal processing section configured to perform signal processing on a pixel signal coming from the photoelectric conversion section.

* * * * *